United States Patent [19]

Shirasu

[11] 4,397,562
[45] Aug. 9, 1983

[54] DIGITAL-ANALOG CONVERTER CIRCUIT FOR SPEECH-SYNTHESIZING ELECTRONIC TIMEPIECE

[75] Inventor: Shinichi Shirasu, Tokorozawa, Japan

[73] Assignee: Citizen Watch Company Limited, Tokyo, Japan

[21] Appl. No.: 237,788

[22] Filed: Feb. 24, 1981

[30] Foreign Application Priority Data

Feb. 26, 1980 [JP] Japan ................................. 55-22981
Apr. 8, 1980 [JP] Japan ................................. 55-45241

[51] Int. Cl.³ ............................................ G04B 21/08
[52] U.S. Cl. ..................................................... 368/63
[58] Field of Search ................ 368/63, 250, 251, 273; 179/1 SA, 1 SM; 5/451

[56] References Cited

U.S. PATENT DOCUMENTS 4,279,030  7/1981  Masuzawa et al. ................... 368/63
4,357,489  11/1982  Henderson et al. ............. 179/1 SM

*Primary Examiner*—Vit W. Miska
*Attorney, Agent, or Firm*—Jordan and Hamburg

[57] ABSTRACT

A novel type of digital-to-analog converter circuit is disclosed for an electronic timepiece having a speech synthesizing capability. The converter circuit utilizes pulse width modulation to form a train of pulses in response to successive digital signals which specify amplitude and polarity values for synthesizing speech, with the pulse widths being determined in accordance with the digital signal values. By filtering out the unwanted high frequency components of this pulse train, speech signals can be synthesized through an audio transducer. Such a digital-to-analog converter is capable of operating in a satisfactory manner at low levels of supply voltage, and has a very low power consumption.

20 Claims, 33 Drawing Figures

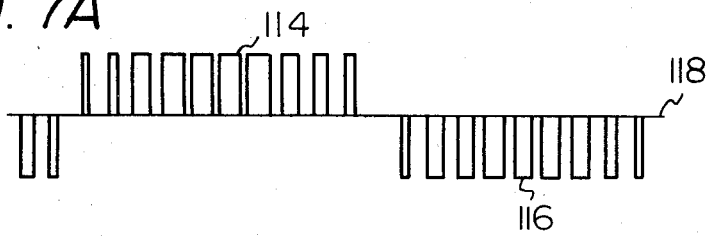
Fig. 7A
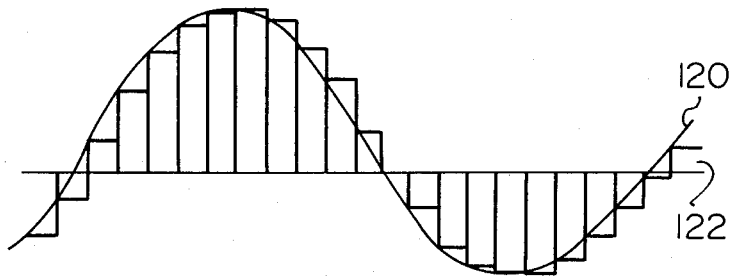
Fig. 7B
Fig. 8
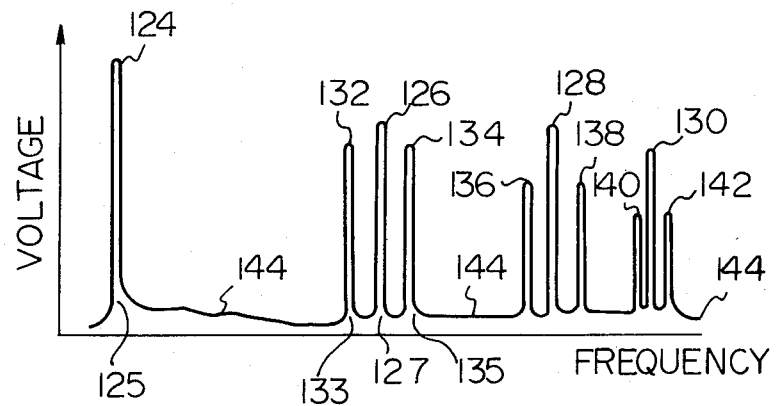

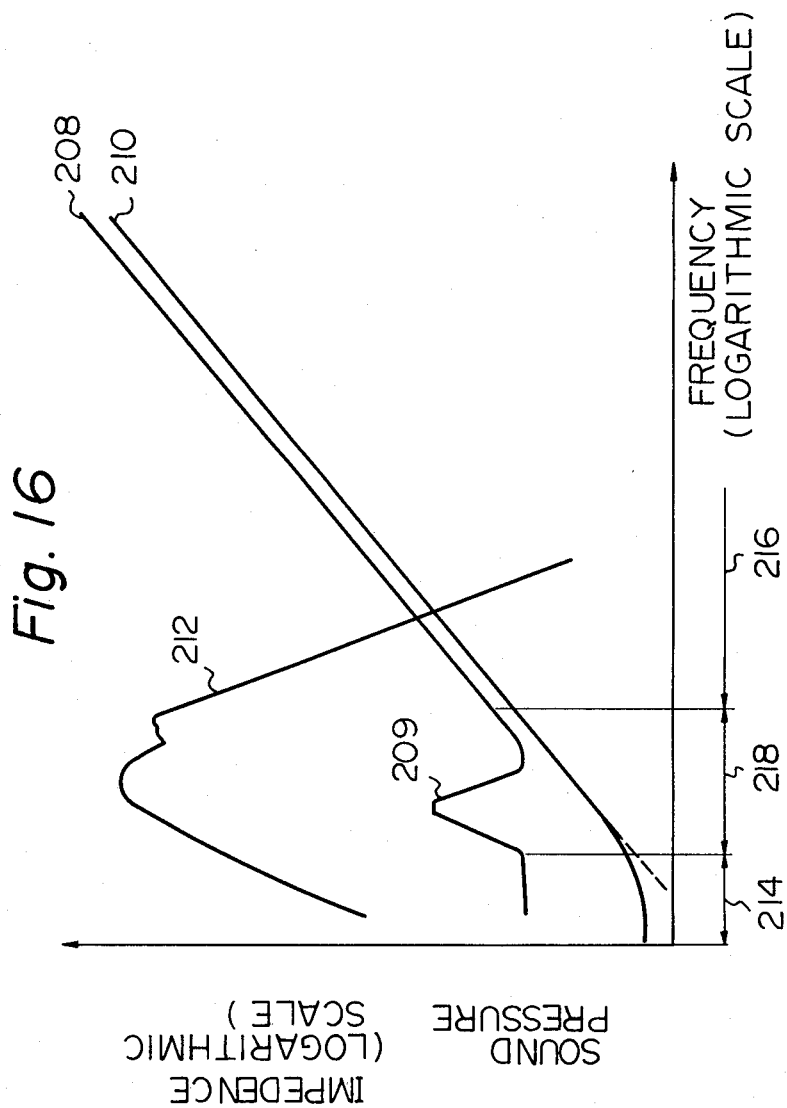

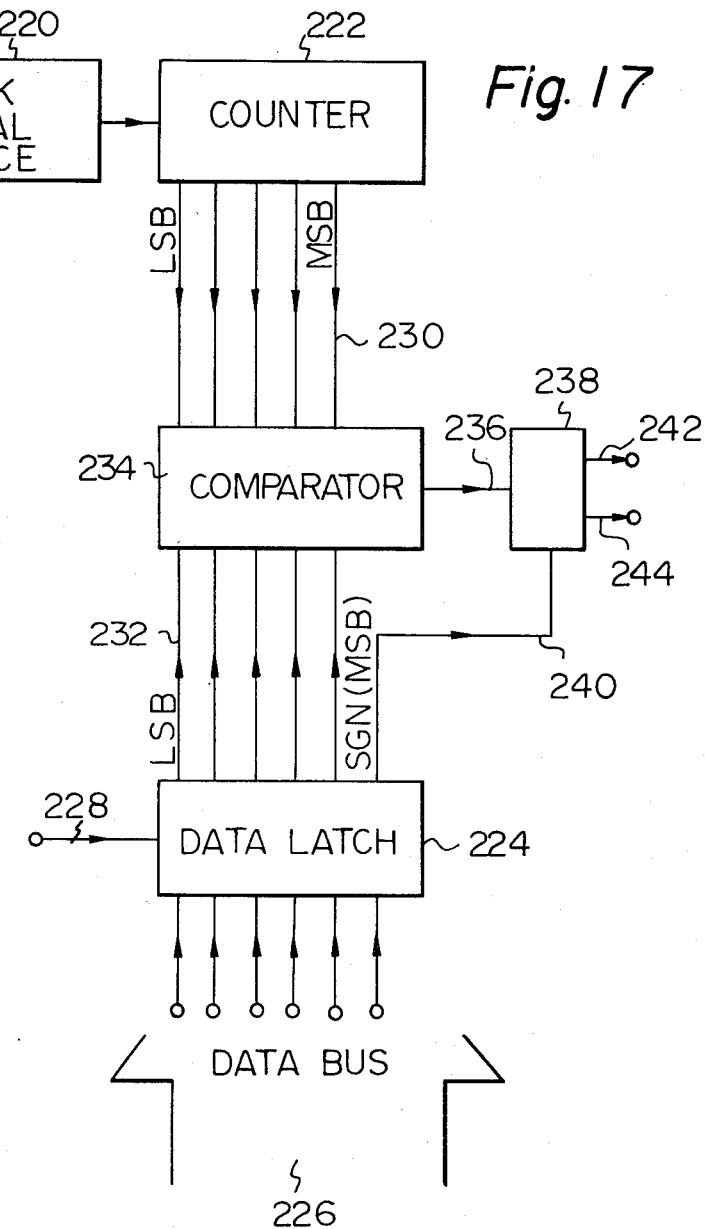

DIGITAL-ANALOG CONVERTER CIRCUIT FOR SPEECH-SYNTHESIZING ELECTRONIC TIMEPIECE

BACKGROUND OF THE INVENTION

The present invention is directed toward an improved digital-to-analog converter circuit for a speech-synthesizing electronic timepiece.

In the past, various means have been adopted for providing audible indications of time information from a timepiece. In the case of conventional mechanical timepieces, this has been performed for example by striking a bell or other sound emitting device, by a number of times which indicates the current time. Somewhat similar methods have been proposed for use in electronic timepieces, for example whereby an audible tone is emitted a number of times in succession to indicate a time value, or combinations of audible tones of different frequencies are emitted. However, due to recent advances in the technology of integrated circuits and memory devices, the sizes of such devices have become such that construction of a timepiece is possible in which indication of time information is given by means of synthesized speech signals. Hitherto, synthesized speech data output has been achieved for some devices of relatively small size such as desk calculators. But in the case of an electronic timepiece, there are certain limitations which have made it extremely difficult to implement in practical form such synthesized speech data output. These limitations are due to the fact that, because of the small size of electronic timepieces in general, the battery which supplies power to the timepiece circuitry is also of very small size, and hence produces a low supply voltage and cannot tolerate a high level of power consumption. For these reasons, all of the circuitry which is utilized for speech synthesis in an electronic timepiece must be capable of operating at a low level of supply voltage, and must have a very low power consumption. However, although the various digital logic circuits and memory circuits associated with a speech synthesis system can be designed to meet these limitations, the digital-to-analog conversion circuit (whereby digital signals representing speech information in sampled and quantized form are converted into analog signals to be output by an audio transducer) presents serious problems in this respect, if conventional types of such digital-to-analog converters ae utilized. The reasons for this will be described hereinafter with reference to circuit examples. Such a digital-to-analog converter produces output signals which are of analog form, and which must be amplified in this form in order to drive an audio transducer. Such amplification is highly inefficient in relation to the power consumption of the digital circuits of an electronic timepiece. Another feature of a conventional digital-to-analog converter circuit is that it is not capable of operating in a satisfactory manner at very low levels of supply voltage, due to limitations imposed by such factor as the saturation voltages of transistor elements, for example.

For these reasons, the application of speech synthesis for providing time information output from electronic timepieces has been hindered by the inherent characteristics of conventional analog-to-digital converter circuits, and there exists an urgent requirement for an improved type of digital-to-analog converter circuit which will be more suited for the special requirements imposed upon circuitry for use in an electronic timepiece. Such an improved type of digital-to-analog converter circuit is disclosed by the present invention.

SUMMARY OF THE INVENTION

The present invention discloses a digital-to-analog converter circuit which is especially suitable for use in a speech-synthesizing electronic timepiece, and which does not present the various disadvantages of prior art digital-to-analog converter circuits as described in the preceding paragraphs. A digital-to-analog converter circuit according to the present invention receives signals supplied from a digital speech synthesis circuit which specify successive values for the amplitude and polarity of a synthesized speech signal, in the form of digital numbers. The digital-to-analog converter circuit serves to produce an output pulse in response to each of these digital numbers, with the width of each pulse being determined by the corresponding digital quantity. This is basically different from a conventional type of digital-to-analog converter circuit in which a particular amplitude of current (or voltage) is produced in response to a digital quantity. When the train of variable pulse width pulses from a digital-to-analog converter circuit according to the present invention is passed through a low-pass filter, the various high frequency components contained in the pulse train are removed, and the remaining speech frequency output comprises an analog signal which can drive an audio transducer to produce synthesized speech in accordance with the digital quantities supplied. As described hereinafter, it may be possible to utilize the electrical and mechanical characteristics of the audio transducer device itself to perform the functions of a low-pass filter, eliminating the need for a separate component.

Since a digital-to-analog converter circuit according to the present invention operates in an entirely digital fashion, i.e. semiconductor elements are either switched completely on or completely off, the power consumption can be made extremely low. In addition, operation at very low levels of supply voltage is possible, by utilizing suitable semiconductor switching components, e.g. MOS transistors. Thus, a digital-to-analog converter circuit in accordance with the present invention is ideally suited to the implementation of a practicable electronic timepiece having a speech synthesizing capability.

BRIEF DESCRIPTION OF THE DRAWINGS

In the appended drawings:

FIG. 7(A) is a diagram illustrating a pulse width modulated signal produced by a digital-to-analog converter circuit according to the present invention;

FIG. 7(B) is a diagram illustrating the waveform resulting from passing the signal of FIG. 7(A) through a low-pass filter, in a digital-to-analog converter circuit according to the present invention.

FIG. 8 is a diagram illustrating the frequency spectrum of a pulse train produced by a digital-to-analog converter circuit according to the present invention, for the case of synthesis of a sine wave;

FIG. 16 is a graph illustrating the relationships between impedance and output sound pressure for an audio transducer utilizable in a digital-to-analog converter circuit according to the present invention;

FIG. 17 is a general block diagram of a pulse width modulation circuit for a digital-to-analog converter circuit according to the present invention;

DESCRIPTION OF THE PREFERRED EMBODIMENTS

Figure 1:
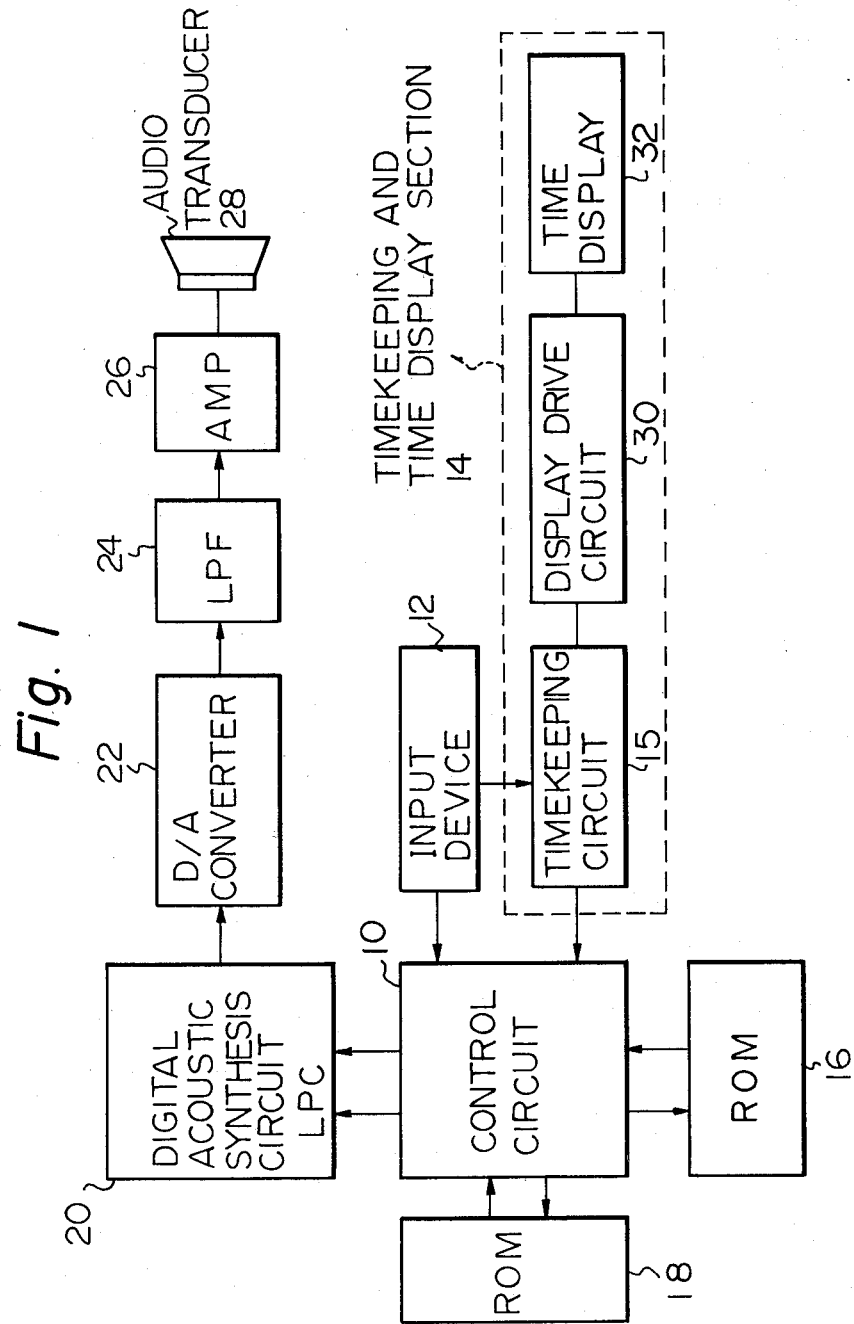
FIG. 1 is a block diagram showing the basic configuration of a speech-synthesizing electronic timepiece according to the prior art.

Referring now to the attached drawings, some embodiments of the present invention will be described. Before describing such embodiments, some basic features of a speech synthesizing electronic timepiece utilizing prior art methods will be described. Referring first to FIG. 1, reference numeral 10 denotes a control circuit. This receives various input signals generated by an input device 12, as well as time data which is generated by a timekeeping and time display section 14. In accordance with the combination of data thus input from external input device 12 and timekeeping and time display section 14, control circuit 10 produces signals which serve to read out data stored in a read-only memory (abbreviated hereinafter to ROM) 16. ROM 16 stores data which specifies the order in which other data stored in a ROM 18 is to be read out, in accordance with the combined data produced by control circuit 10. Basic speech synthesis data is thereby read out from ROM 18 by control circuit 10 and transferred to a digital acoustic synthesis circuit 20. In response, digital acoustic synthesis circuit generates a train of digital numeric values. Each of these digital data values, comprising a number of data bits, specifies the amplitude of an acoustic signal waveform during a predetermined time interval of very short duration, which will be referred to herein as a sampling interval. These digital data values are applied as digital signals to a digital-to-analog converter circuit 22 which produces a signal amplitude during each of the sampling intervals whose value is determined by the corresponding digital signal value output from digital acoustic synthesis circuit 20. The output signals from digital-to-analog converter circuit are input to a power amplifier circuit 26, through a low-pass filter 24. The analog signal thus produces is applied to drive an audio transducer 28, to generate audible speech signals. The audio output may be into air or into water.

Control circuit 10 may also perform the function of removing power from ROMs 16 and 18, digital acoustic synthesis circuit 20, digital-to-analog converter circuit 22, low-pass filter 24, and power amplifier 26 during times when speech synthesis is not being performed.

The digital acoustic synthesis circuit 20 may utilize various methods for generating the digital signals to be input to digital-to-analog converter circuit 22 on the basis of digital data from control circuit 10. Such methods include the PARCORDER (partial automatic correlation) method, the LPC (linear predection-coding) method, or the Cepstrom method. The low-pass filter 24 serves to remove various unwanted high frequency components from the output of digital-to-analog converter circuit 22.

Timekeeping and time display section 14 can be of conventional form, including a timekeeping circuit 15 containing a standard frequency oscillator and frequency divider circuits, a display drive circuit 30 which receives output signals from timekeeping circuit 15, and a time display 32 which is driven by signals from display drive circuit 30.

Figure 2:
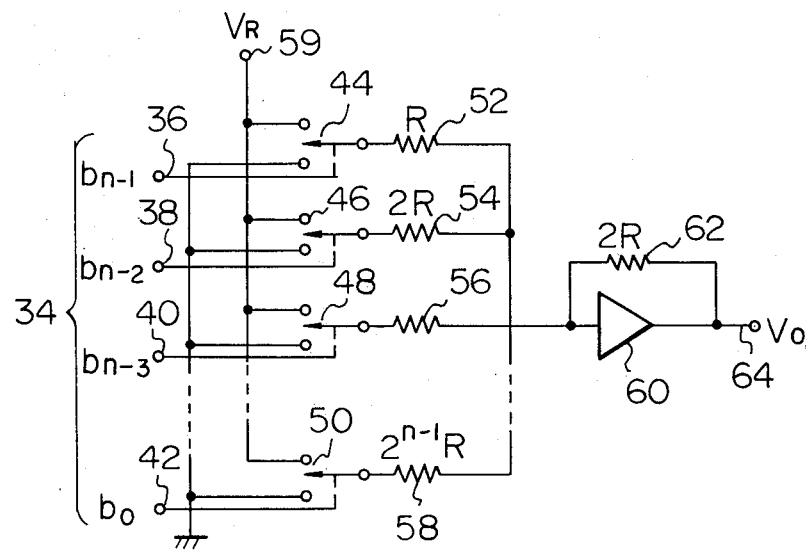
FIG. 2 is a circuit diagram of an example of a digital-to-analog converter circuit according to the prior art.

Referring now to FIG. 2, an example of a specific configuration for digital-to-analog converter circuit 22 is shown. This is of the weighted resistor type, which is widely known and utilized. Numeral 34 denotes a set of input terminals, to which digital signals are applied, i.e. from digital acoustic synthesis circuit 20. These digital signals control a set of electronic switches denoted by reference numerals 44 to 50. Switches 44 to 50 serve to connect each of a corresponding set of resistors 52 to 58, in a weighted resistor ladder network, to either a reference voltage Vr applied to terminal 59, or to ground potential, in accordance with the input digital signals. The values of resistors 52 to 58 are successively weighted as indicated in the diagram, and the resistor weights correspond to the significance of the bits of the digital signal controlling switches 44 to 50. Thus, for example, the most significant bit of the digital input signal, is applied to terminal 36, while the least significant bit is applied to terminal 42. Numeral 60 denotes an operational amplifier, having a feedback resistor 62. A voltage is developed at the output terminal 64 of amplifier 60 whose value is proportional to the sum of the currents flowing in resistors 52 to 58, and hence is proportional to the value represented by the digital input signal.

Figure 3:
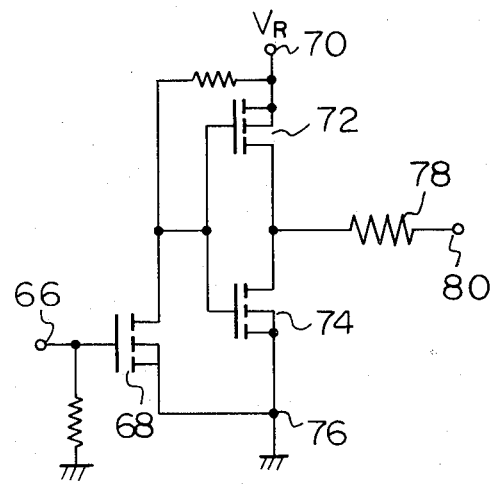
FIG. 3 is a circuit diagram of an electronic switch used in the circuit of FIG. 2.

FIG. 3 shows a circuit configuration utilizable for each of the electronic switches 44 to 50 of FIG. 2. An input transistor denoted by reference numeral 68 serves to amplify a digital signal applied to terminal 66 to a level close to that of the supply voltage, i.e. reference voltage Vr. As a result, depending upon the signal input, the circuit attains a state either in which transistor 72 is saturated and transistor 74 is cut off, or in which transistor 72 is cut off and transistor 74 is saturated. Thus, one end of weighting resistor 78 is connected either to the reference potential Vr or to ground potential.

The accuracy of a digital-to-analog converter circuit such as that of FIG. 2 is determined by the performance of the electronic switches such as that of FIG. 3. For example, if the saturation voltages of transistors 70 and 74 are sufficiently small with respect to the reference voltage Vr, then a satisfactory performance can be obtained. Thus, for a power supply voltage, i.e. Vr, of 10 volts or more, accurate digital to analog conversion can be attained. However, in the case of an electronic timepiece, the voltage available for supply as Vr is much smaller, so that the effects of variations in the transistor saturation voltages upon the circuit operation will be extremely large. Another factor to be considered is that, below a certain level of supply voltage, the linearity of operational amplifier 60 becomes poor, thereby further reducing the accuracy of digital to analog conversion. For these reasons, it is undesirable to use a digital-to-analog converter circuit such as that of FIG. 2 in the circuitry of an electronic timepiece.

Figure 4:
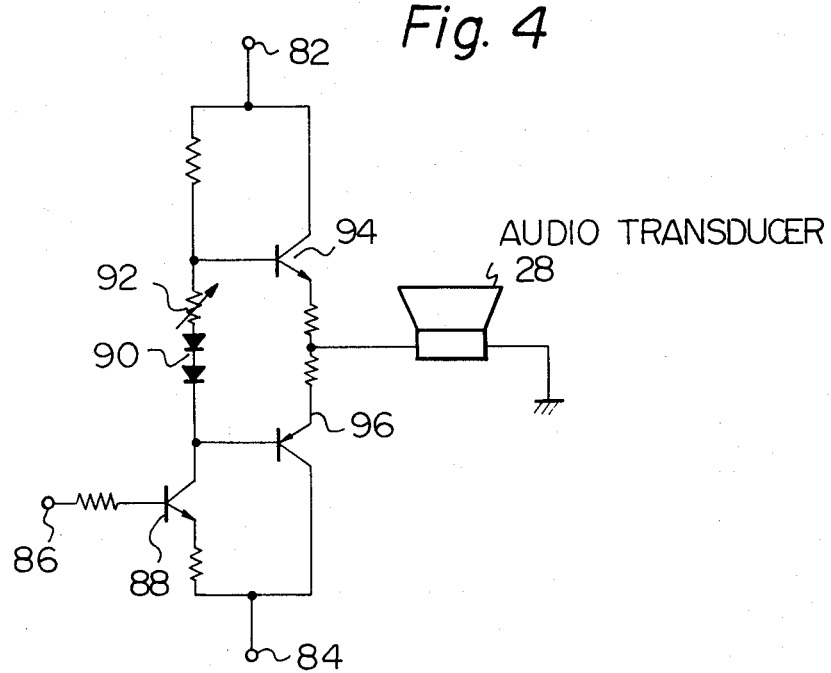
FIG. 4 is a circuit diagram of a power amplifier used with a digital-to-analog converter circuit of the prior art such as that of FIG. 2.

Referring now to FIG. 4, an example of a power amplifier circuit commonly used in the prior art is shown. Such an amplifier may be used to provide an output current in response to the output voltage from the digital-to-analog converter circuit of FIG. 2. An input transistor, denoted by reference numeral 88, receives an input signal voltage from terminal 86, and produces an output voltage which appears at the bases of transistors 94 and 96. These transistors are thereby driven alternately into conduction and into the cut-off condition, thereby driving audio transducer 28. Such an amplifier has the disadvantage that, since transistors 96 and 94 are periodically driven toward or into the cut-off state, a high level of crossover distortion is produced. This can be reduced by applying a bias voltage between the bases of transistors 94 and 96 by means of a low impedance such as that comprising resistor 92 and diodes 90. However, since this results in a steady-state current flow in transistors 94 and 96, the power consumption of the amplifier is increased. Thus, although this is basically a Class B amplifier circuit, which should provide a high efficiency of operation, measures to reduce the level of crossover distortion will result in lower efficiency, i.e. increased power consumption.

Figure 5:
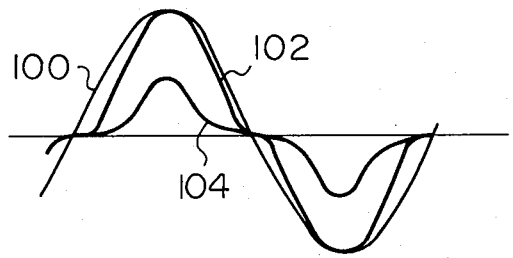
FIG. 5 is a diagram illustrating waveform distortion produced by a power amplifier such as that of FIG. 4.

The waveform diagram of FIG. 5, illustrates such distortion. Here, numeral 100 denotes a sine wave, which, when amplified by an amplifier such as that of FIG. 4 produces a distorted output such as that denoted by reference numeral 104. By bias current adjustment, this can be reduced, to for example the amount of crossover distortion represented by the waveform of reference numeral 102. Thus, it is difficult to amplify accurately signals of small amplitude with an amplifier circuit such as that of FIG. 4.

From the above, it can be understood that a conventional type of digital-to-analog converter circuit and power amplifier are not satisfactory for use in generating analog signals for driving the audio transducer of a speech-synthesizing electronic timepiece, for reasons of high power consumption and inaccurate operation at low levels of supply voltage.

Figure 6:
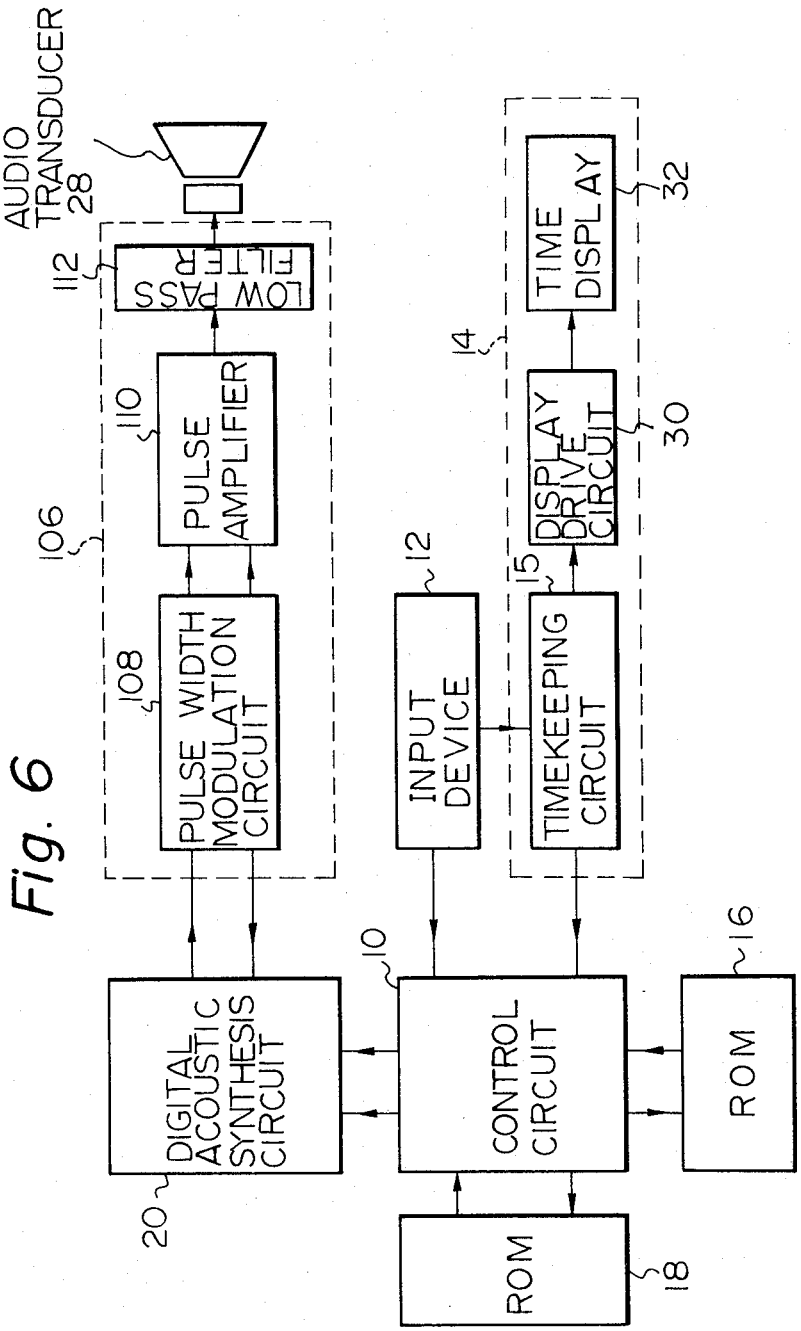
FIG. 6 is a general block diagram of a speech-synthesizing electronic timepiece utilizing a digital-to-analog converter circuit according to the present invention.

Referring now to FIG. 6, a general block diagram is shown therein of a speech-synthesizing electronic timepiece which utilizes a digital-to-analog converter circuit according to the present invention. The functions of the timekeeping and time display section 14 and of control circuit 10, ROMs 16 and 18, digital acoustic synthesis circuit 20 and input device 12 are all similar to those described for the prior art embodiment of FIG. 1, and so will not be further described. Numeral 106 denotes a digital-to-analog converter circuit in accordance with the present invention. This comprises a pulse width modulation circuit 108, a pulse amplifier circuit 110, and a low-pass filter 112. The pulse width modulation circuit 108 produces a train of pulses in response to digital signals supplied from digital acoustic synthesis circuit 20, with the pulse widths being modulated in accordance with values represented by successive digital signals. These pulses can be arranged to designate either a positive or a negative flow of current through the audio transducer 28, in accordance with the data supplied from digital acoustic synthesis circuit 20. The pulses from pulse width modulation circuit 28 are applied to a pulse amplifier 110, which produces in response pulses of current to be transferred through low-pass filter 112 to drive the audio transducer 28. As described hereinafter, a pulse width modulation circuit according to the present invention preferably produces a train of pulses having a fixed period between the midpoints of successive pulses. However, it is also possible to utilize a simple pulse width modulation circuit which produces some degree of variation in the pulse period, although this will result in a certain degree of phase distortion in the synthesized audio output.

Referring now to FIGS. 7(A) and 7(B), the waveforms of signals generated by a digital-to-analog converter circuit according to the present invention are illustrated. FIG. 7(A) shows the output signal from pulse width modulation circuit 108 for the case of synthesis of one cycle of a sine wave. As shown, this comprises a set of variable width pulses 114 which are positive-going with respect to a reference zero level 118 and a sets of negative-going pulses 116. FIG. 7(B) shows the waveform resulting from integration of the pulses of FIG. 7(A) by a low-pass filter, to thereby reconstitute the original sine wave signal. As shown, high frequency components are contained in this resultant signal.

Referring now to FIG. 8, the frequency spectrum of the pulse train produced by pulse width modulation circuit 108 is shown, for the case of synthesizing a sine wave. Numerals 124 and 125 denote the amplitude and frequency of a component of the pulse train corresponding to the original sine wave signal. Numeral 126 denotes a high frequency component at the frequency 127 of the repetition rate of the modulated width pulses, i.e. the sampling frequency. Numerals 128 and 130 denote components corresponding to harmonics of the pulse repetition frequency. Numerals 132 and 134 denote sidebands of the sampling frequency component, which are separated from the sampling frequency 127 by the value of the original sine wave signal. Similarly reference numerals 140 and 142 denote sidebands of high frequency component 130. Numeral 144 denotes a quantization noise component. The ratio of the amplitude of this component to the sine wave component 124 is determined by the number of quantization levels at which the original sine wave was sampled. If for example a total of 127 quantization levels are used, then the ratio of desired signal/quantization noise is of the order of 50 dB. If we assume that component 124 represents the highest frequency component which is to be synthesized, then it is necessary to ensure that the sampling frequency component 126 is at a sufficiently high frequency that the lower sideband 132 of this component does not overlap any of the frequencies to be synthesized, such as 124. If this is done, and if the output pulses from pulse width modulation circuit are passed through a low-pass filter then if the cut-off frequency of this low-pass filter is lower than the lower sideband frequency 133 of the sampling frequency (i.e. the repetition frequency of the variable width pulses), and is higher than the highest frequency to be synthesized (e.g. frequency 125) then all frequency components of the pulse train other than the desired frequency of component 124 can be excluded.

Figure 9:
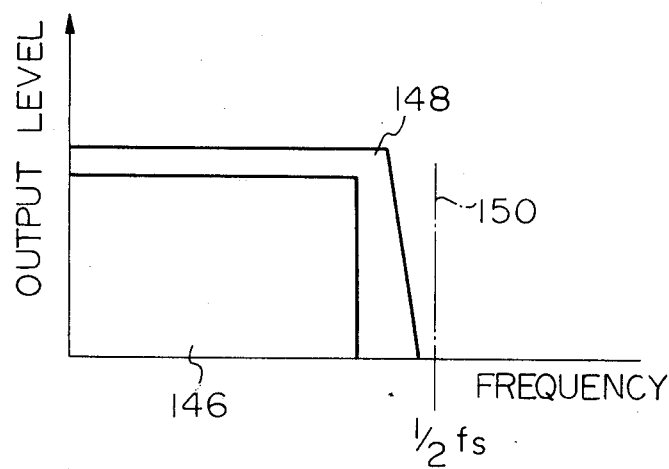
FIG. 9 is a diagram illustrating the requirements for a low-pass filter in a digital-to-analog converter circuit according to the present invention.

These requirements for low frequency filtration are illustrated in FIG. 9. Here, reference numeral 146 denotes the frequency band within which acoustic synthesis is to be performed, numeral 148 denotes the frequency response of low pass filter 112, and reference numeral 150 denotes a frequency ½fs corresponding to ½ of the sampling frequency. As indicated, the cut-off frequency of the low-pass filter should be less than half of the sampling frequency fs, and higher than the maximum frequency which is to be synthesized.

Figure 10:
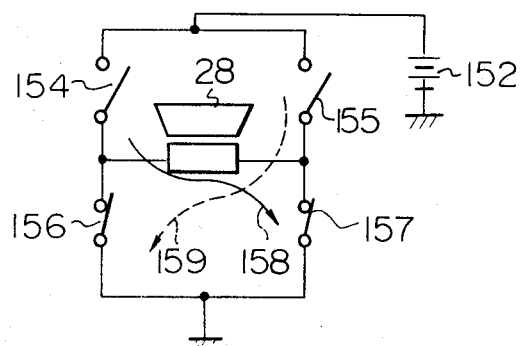
FIG. 10 is an equivalent circuit diagram of a pulse amplifier at the output of a digital-to-analog converter circuit according to the present invention.

Referring now to FIG. 10, a diagram is shown of the equivalent circuit of an embodiment of a pulse amplifier circuit for a digital-to-analog converter circuit according to the present invention. For simplicity of description, the low-pass filter 112 is omitted from the figure. The reference numeral 152 denotes a power source, and reference numeral 154, 155, 156 and 157 denote a set of electronic switches which are controlled by the output pulse train from pulse width modulation circuit 108. If it is assumed for example that these electronic switches are controlled to generate current pulses such as are shown in FIG. 7(A) above, then during each of the pulses 114 of FIG. 7(A), switches 154 and 157 are closed so that current flows through audio transducer 28 in the direction indicated by arrow 158. During each of the pulses 116 in FIG. 7(A), switches 155 and 156 are closed, and switches 154 and 157 are opened, so that current flows in audio transducer in the direction indicated by arrow 159. In the intervals between pulses, switches 156 and 157 are closed, to establish a short circuit condition across the drive coil of audio transducer 28, while switches 154 and 155 are opened.

Figure 11A:
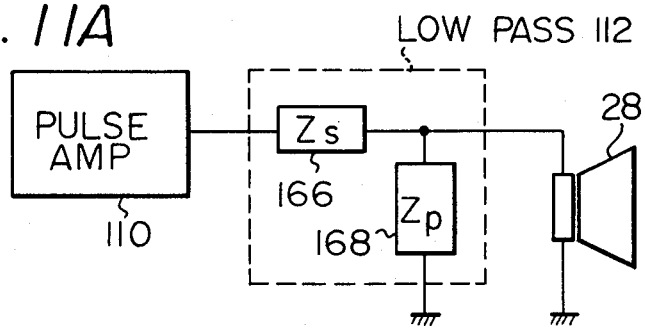
FIGS. 11(A) to 11(C) illustrate various configurations of low-pass filter coupled to the output of a pulse amplifier according to the present invention.
Figure 11B:
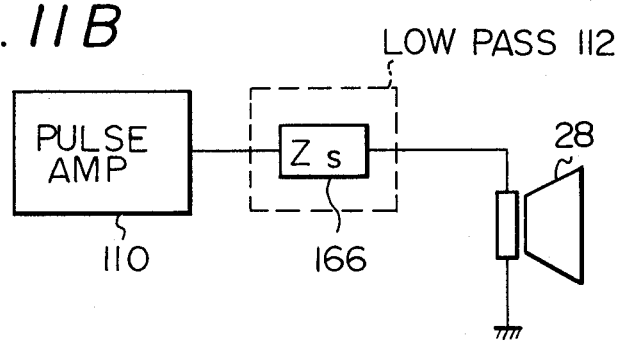
Figure 11C:
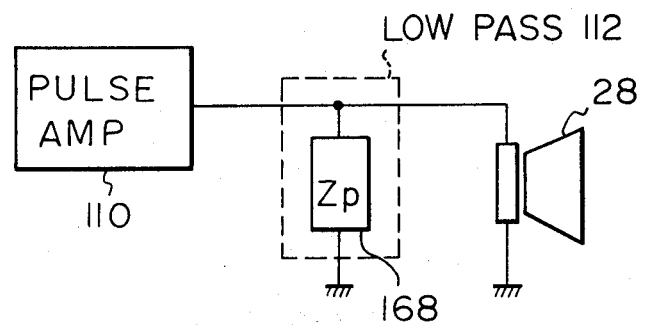

Referring now to FIGS. 11(A), 11(B) and 11(C), various types of low-pass filter utilizable with the present invention are shown. FIG. 11(A) shows a low-pass filter comprising an L-type filter configuration made up of a series element 166 and a shunt element 168. In the example of FIG. 11(B), a single series element is used, denoted by reference numeral 166. In the example of FIG. 11(C), a single shunt element is used, denoted by reference numeral 168. In order to reduce power dissipation as far as possible, it is desirable to reduce or eliminate completely the number of shunt elements in low-pass filter 112. For this reason, the configuration of FIG. 11(B), with a single series element, is preferable.

Basically, it is desirable that a low-pass filter according to the present invention should have a high input impedance above some predetermined cut-off frequency, and a low input impedance below that cut-off frequency.

Figure 12:
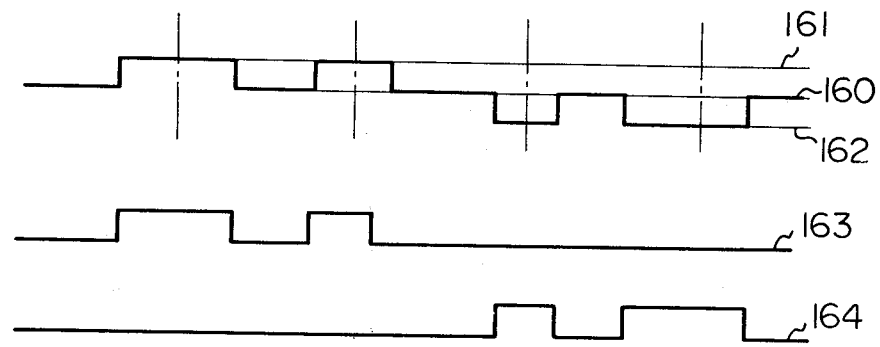
FIG. 12 is a waveform diagram helpful in explaining the operation of a circuit shown in FIG. 13.
Figure 13:
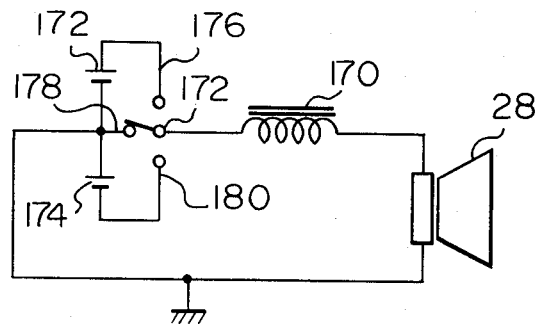
FIG. 13 is a diagram illustrating the basic configuration of the output components of a digital-to-analog converter circuit according to the present invention, for the cases of a low-pass filter comprising a choke-type filter.
Figure 14:
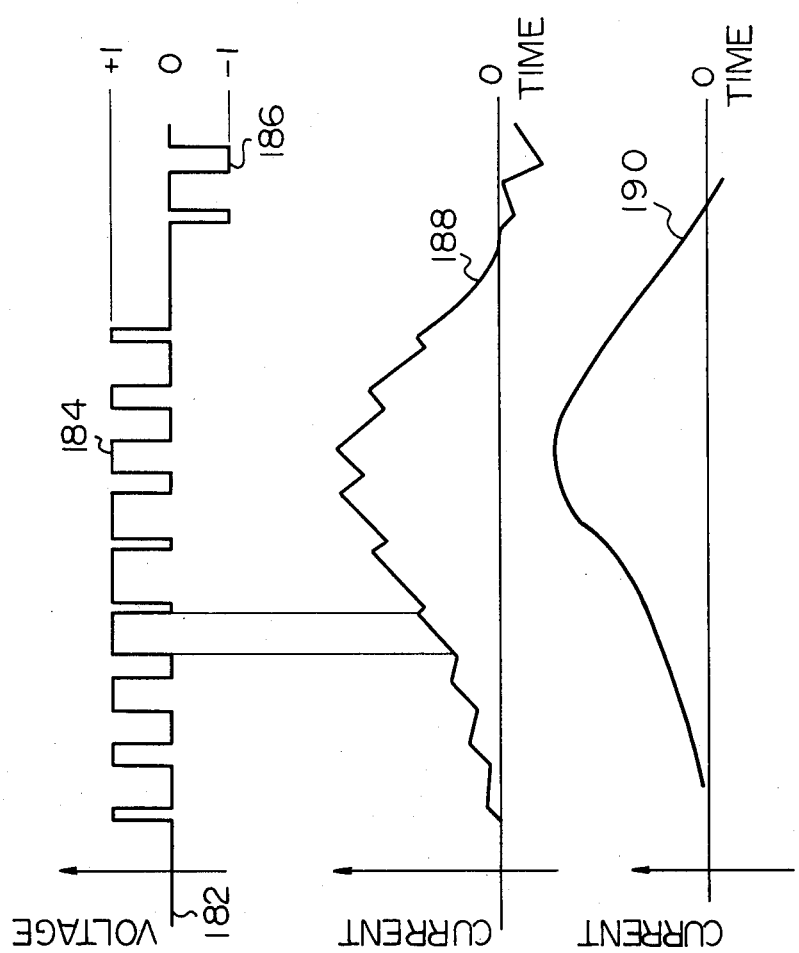
FIGS. 14(A), 14(B) and 14(C) are waveform diagrams illustrating the effects of filtration upon a pulse width modulated pulse train produced by a digital-to-analog converter circuit according to the present invention.

The combined operation of pulse amplifier 110, low-pass filter 112, and audio transducer for a digital-to-analog converter circuit according to the present invention will now be described, with reference to FIG. 12, FIG. 13 and FIG. 14. In FIG. 12, reference numeral 160 denotes typical pulses which are applied to the input of low-pass filter 112, which in the example of FIG. 13 comprises a single series element, i.e. a choke type filter. The pulses 160 vary between a positive potential 161 and a negative potential 162. In FIG. 13, a pulse amplifier circuit such as that of FIG. 10 is shown in simplified equivalent circuit form, in which the positive potential level 161 of FIG. 12 is produced by a power source 172 and the negative potential 174 is produced by power source 174. The operation of pulse amplifier circuit 110 can be considered to be equivalent to connecting a movable terminal 172 in FIG. 13 to a fixed terminal 176 in response to each of a set of positive-going variable width pulses 163 shown in FIG. 12, and connecting the movable terminal 172 to a fixed terminal 180 in response to each of a set of negative-going pulses 164 in FIG. 12, with the duration of each connection interval being determined by the width of the corresponding pulse. These pulses are output from pulse width modulation circuit 108, which includes a polarity distribution circuit whereby either a set of pulses such as denoted by reference numeral 162, specifying one direction of current flow in audio transducer (e.g. the positive direction) or a set of pulses 164 in FIG. 12, specifying current flow in audio transducer in the opposite direction. The operation of this polarity distribution circuit is controlled in accordance with the digital signals applied to pulse width modulation circuit 108 from digital acoustic synthesis circuit 20, as described hereinafter.

Thus, in response to a train of variable width pulses which are either positive going (between a logic +1 level and 0, for example as shown in FIG. 14(A) or a logic −1 level and 0), current flows through the filter element 170, having the waveform such as that indicated in FIG. 14(B). As shown, the low-pass filter serves to integrate the variable width voltage pulses, to produce a current waveform whose amplitude varies in proportion to the widths of the input pulses. By increasing the time constant of this integration, a more smoothly varying current waveform can be produced, as shown in FIG. 14(C). Since this current flows in the audio transducer, an audio speech signal corresponding to the contents of the pulse train output from pulse width modulation circuit is reproduced by audio transducer, i.e. speech synthesis is performed in accordance with digital data supplied from digital acoustic synthesis circuit 20.

Figure 15:
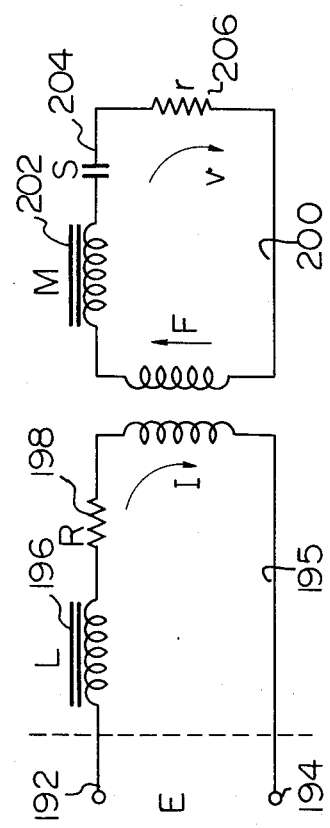
FIG. 15 is an equivalent diagram of the electrical and mechanical circuits of an audio transducer.

Referring now to FIG. 15, an equivalent circuit diagram is shown therein of the electrical and mechanical characteristics of an audio transducer which comprises a miniature dynamic loudspeaker having a voice coil. The reference numeral 195 denotes the electrical circuit, and 200 the mechanical circuit. Numeral 196 denotes the reactance of the voice coil, and 198 the resistance of the voice coil. Numerals 202 and 204 and 206 denote the electrical equivalents of the mass, stiffness and mechanical resistance of the loudspeaker, respectively.

The characteristics of an audio transducer having an equivalent circuit such as that of FIG. 15 are shown in FIG. 16, which shows the variations in output sound pressure and input impedance for such a audio transducer when connected in series with a choke coil serving as a low-pass filter, such as that denoted by numeral 170 in FIG. 13. Numeral 208 denotes the impedance of the audio transducer, 210 the choke coil impedance characteristic, numeral 202 denotes the output sound pressure characteristic, The impedance characteristic of the audio transducer is made up of a low-frequency region 210, which is determined by the voice coil equivalent resistance 198 shown in FIG. 15, a high frequency region 216, determined by the voice coil reactance 196, and a sound generation region 218, having a shape which is determined by the values of the equivalent mechanical circuit 200 of FIG. 15. In the low frequency region 214, and in the high frequency region 216, the output sound pressure falls sharply. In the high frequency region 216, the effect of this fall-off in sound pressure in reducing the level of sound output for a given amplitude of drive signal applied to the audio transducer is even greater than that due to the increased impedance of the audio transducer voice coil in the high frequency region. Thus, due to the combination of these two effects, the audio transducer itself acts in effect as a type of low-pass filter, displaying a sharply reduced response to applied drive voltage signals in the high frequency range. Strictly speaking, the audio transducer acts as a band-pass filter, if the filter input is considered to be a drive voltage signal and the filter output is considered to be output sound pressure. Thus, it is possible to eliminate the series element 170 of FIG. 13 from a digital-to-analog converter circuit according to the present invention, if a suitable type of audio transducer is utilized, and if the repetition rate of the variable width pulses is selected to be sufficiently high to be effectively attenuated by the filtering action of the audio transducer.

Referring now to FIG. 17, an embodiment of a pulse width modulation circuit for a digital-to-analog converter circuit according to the present invention is shown in simplified block diagram form. Numeral 220 denotes a clock signal source, which produces a clock signal to be counted by a counter circuit 222. This counter circuit 222 can be a reversible counter which alternately counts up to a maximum count value, and down to a minimum value, and can comprise for example an up/down counter together with suitable gate and flip-flop circuits, as described hereinafter. Numeral 224 denotes a data latch circuit, which serves to store digital data input on a data bus 226. This digital data comprises the digital signals produced by digital acoustic synthesis circuit 20 of FIG. 6. Latching of this data into data latch 224 is controlled by a latch signal applied to a terminal 228. A comparator circuit 234 serves to compare the magnitude of the data represented by the contents of data latch circuit 224 with that represented by the current count state of counter 222. If the count in counter 222 is greater than the contents of data latch 224, then one logic state will be attained by an output signal from data latch 234, denoted by numeral 236. The latter logic state will be assumed to be a high logic level (abbreviated hereinafter to H level) state. If on the other hand the contents of counter 222 are less than the contents of data latch 224, then the opposite logic state (referred to hereinafter as the L level) will be attained by the output signal 236. As will be shown hereinafter, this results in a train of variable width pulses being output as signal 236, with the period of these pulses being determined by the rate at which successive sets of data bits are input on data bus 226. The most significant bit of the latter data bits serves to designate the polarity of a current flow in audio transducer 28 to be generated in response to a corresponding output pulse of signal 236. This is achieved by controlling the operation of a polarity distribution circuit 238 in accordance with the latter most significant bit, (abbreviated hereinafter to "sign bit"). As a result, pulses are output either on a line 242 from distribution circuit 238, to cause a positive current flow component in audio transducer 28, or on a line 244, to cause a negative current flow component in audio transducer 28.

Figure 18:
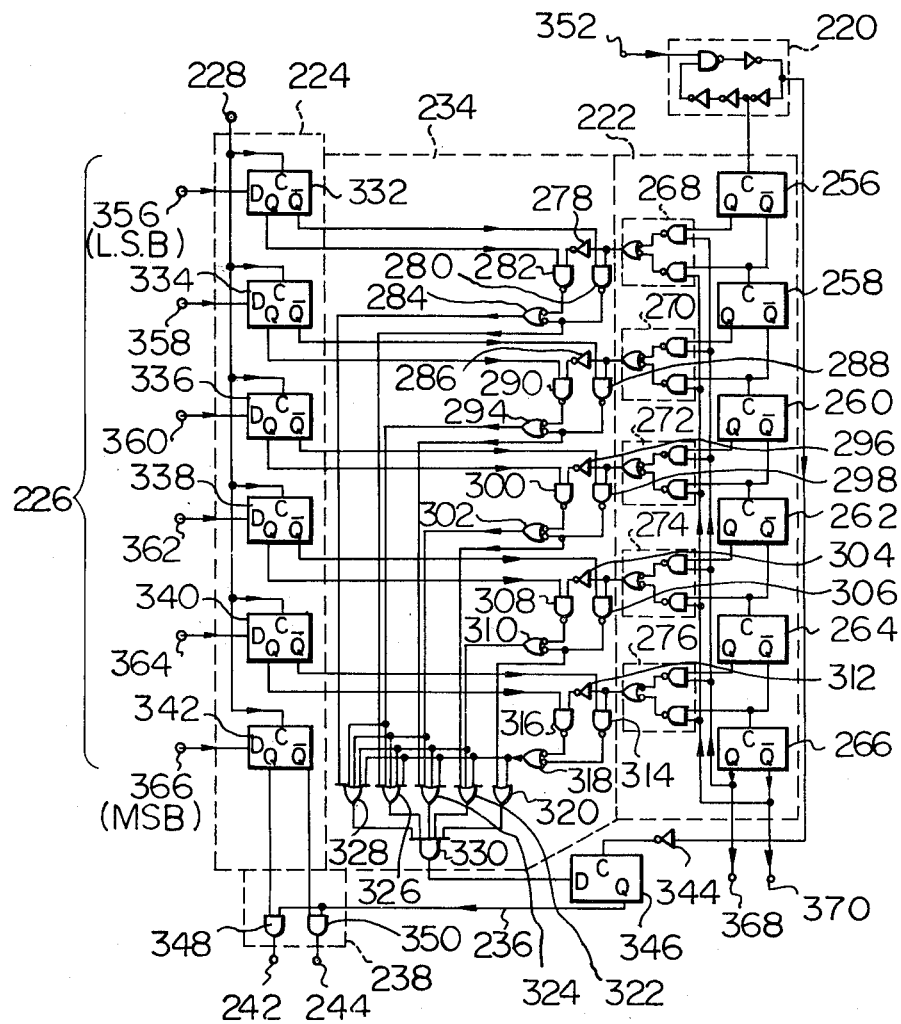
FIG. 18 is a circuit diagram of a pulse width modulation circuit for a digital-to-analog converter circuit according to the present invention.

Referring now to FIG. 18, a circuit diagram is shown therein of a preferred embodiment of a pulse width modulation circuit in accordance with the present invention. The circuit blocks shown surrounded by broken line outlines and designated by numerals 222, 220, 224, 234 and 238 correspond to the blocks having these numerals shown in FIG. 17. Counter 222 comprises a ripple counter circuit made up of flip-flops 256 to 266. Numerals 268 to 276 denote a set of data selectors, which select either the non-inverting or the inverting output (Q or $\overline{Q}$) of a corresponding one of flip-flops 268 to 276 in accordance with the state of a final counter stage flip-flop 266. While output Q from flip-flop 266 is at the H logic level, the Q outputs from each of flip-flops 256 to 264 are selected, and counter 222 operates in an up-count mode, while when the $\overline{Q}$ output from flip-flop 266 is at the H level, the $\overline{Q}$ outputs from flip-flops 256 to 264 are selected, so that counter 222 operates in a down-count mode.

Data latch circuit 228 comprises a set of data type flip-flops 332 to 342, which latch in a set of data bits 226 applied to terminals 356 to 366 at a time controlled by a signal applied to control terminal 228, i.e. to latch in the digital signals produced by the digital acoustic synthesis circuit 20.

Data comparator circuit 234 comprises a set of five comparator stages, a typical one of which is made up of NAND gates 280 and 282, inverter 278 and OR gate 284 having inverting inputs. The output from data selector 268 is applied to one input of NAND gate 280, and to the input of inverter 278, while the Q output of flip-flop 332 of data latch circuit 224 is applied to an input of NAND gate 282 and the $\overline{Q}$ output of flip-flop 332 is applied to an input of NAND gate 280. The outputs of the OR gates 284, 294, 302, 310 and 318 are applied to inputs of a set of OR gates 320 to 328 whose outputs are applied to the inputs of an AND gate 330. As a result, if the current count in counter circuit 222 is less than the digital value represented by the contents of latch circuit 224, the output from AND gate 330 will be at the H logic level, while if the current count in counter circuit 222 is less than the value stored in latch circuit 224, then the output from AND gate 330 will be at the L logic level.

In order to eliminate the effects of any transient impulses appearing on the output from AND gate 330, the output from this gate is latched into a data-type flip-flop 346 by an output from clock signal generator 220. The resultant train of variable width pulses from the output of flip-flop 346 is applied to a polarity distribution circuit 238, comprising two AND gates 348 and 350. AND gates 348 and 350 are controlled by the inverting and non-inverting outputs from flip-flop 342 of data latch circuit 224, i.e. in accordance with the state of the sign bit of the data currently stored in latch circuit 224. If this sign bit is at the H level, then the variable width pulse train from flip-flop 346 will be transferred through AND gate 348 to output terminal 242. If the sign bit is at the L logic level, the pulse train from flip-flop 346 will be transferred through AND gate 350 to output terminal 244.

Figure 19:
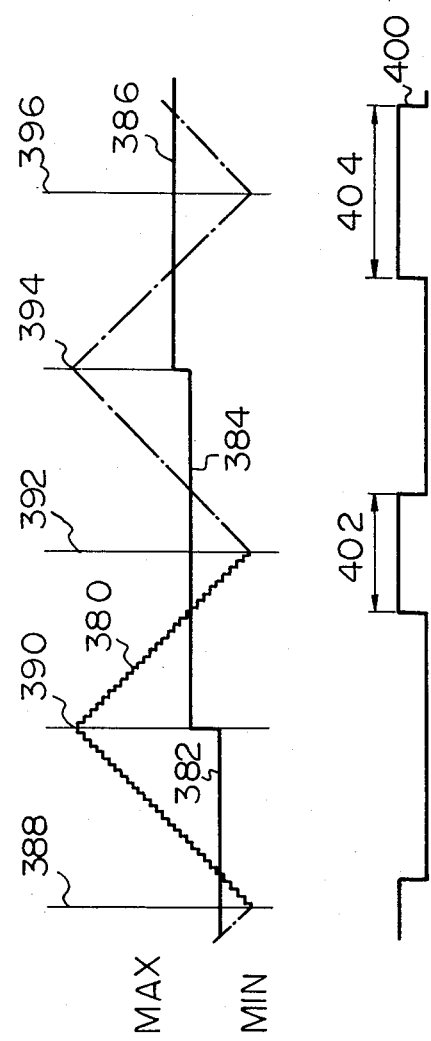
FIG. 19 is a waveform diagram illustrating the relationship between input digital values and output pulse width from a pulse width modulation circuit according to the present invention.

The operation of the circuit of FIG. 18 may be understood with reference to the waveform diagrams of FIG. 19. Here, numeral 380 denotes the count state of counter 222, which as can be seen periodically counts up to a maximum count value and then counts down to a minimum count value. In this embodiment, it is assumed that a transition from the count-up state to the count-down state occurs in synchronism with input of a new set of digital data to data latch circuit 224, i.e. at times denoted by numerals 390 and 394. The values represented by the contents of data latch circuit 224 are indicated by numerals 382, 384 and 396, e.g. the digital data stored in data latch circuit 224 during the interval between points 390 and 394 represents a magnitude indicated by the level 384. The output pulses generated by the circuit of FIG. 18 are indicated by numeral 400, e.g. during the interval between time points 390 and 394, the count value of counter 222 is less than the value currently stored in latch circuit 224 during a certain interval. As a result, an output pulse is generated by data comparator circuit 234, i.e. from flip-flop 346, as denoted numeral 402. The duration of this pulse 402 is proportional to the value represented by the contents of flip-flops 332 to 340 of data latch circuit 224, i.e. by the data bits applied to terminals 356 to 364. If the contents of data latch circuit 224 then change, a pulse of different width will then be generated by data comparator 234, as denoted by numeral 404.

In the pulse width modulation circuit embodiment of FIG. 18, the mid-point of each pulse in the width-modulated pulse train output coincides with the point at which counter 222 changes over from a count-down state to the count-up state. This is ensured by the fact that control of the operation of counter circuit 222 is synchronized with the timing of latching in new data to data latch circuit 224. This condition can be established, for example, by applying the output from terminal 370 of final counter stage 266 to the latch control terminal 228 of data latch circuit 224.

Figure 20:
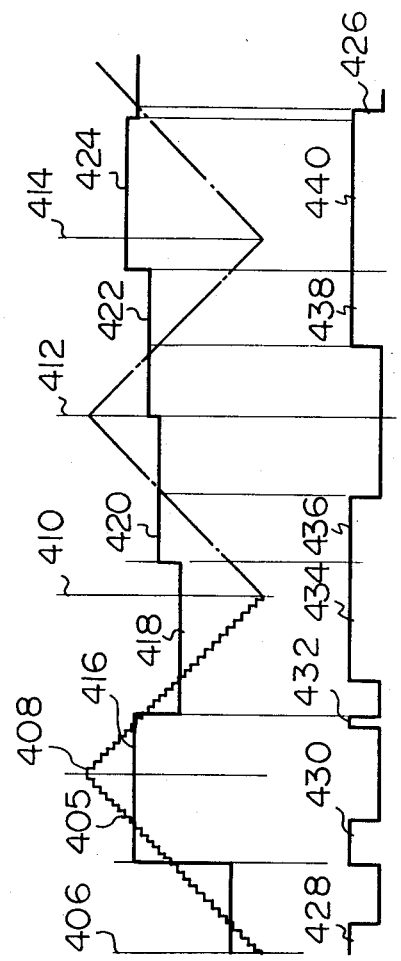
FIG. 20 is a second waveform diagram illustrating the relationship between digital signal values and an output pulse train from a digital-to-analog converter circuit according to the present invention.

Although it is desirable to establish a constant period between the mid-points of the pulses in the output from pulse width modulation circuit, this is not absolutely necessary. However if the latter period does vary to some degree, a certain amount of phase distortion will be produced in the synthesized acoustic output from the audio transducer. FIG. 20 illustrates waveforms for a case in which the operation of counter circuit 222 and data latch circuit 224 are not synchronized. As in FIG. 19, the contents of counter circuit 222 and data latch circuit 224 are shown in analog form. Numeral 405 denotes the contents of counter circuit 222 and numerals 416, 418, 420, 422 and 424 denote successive contents of data latch 224. The output pulse waveform from data comparator 234 is denoted by numeral 426. It will be apparent that during any one half-cycle of counter circuit 222, e.g. during the interval between the points denoted by 408 and 410, the average duration of the pulse output from data comparator 234, as indicated by numerals 432 and 434, will have a value proportional to the mean of the values stored successively in data latch circuit 224 during that half cycle, i.e. the mean of the values represented by numerals 416 and 418. Thus, even if the operation of counter circuit 222 is not synchronized with the operation of data input to data comparator 234, an analog component will be contained in the output pulse train from data comparator 234 which corresponds to the succesive digital data sets supplied from digital acoustic synthesis circuit 20.

If the period of operation of counter circuit 222, (i.e. the period between successive transitions from the up-count to the down-count state) is less than the period between successive changes in the output data from data latch circuit 224, then the pulse width modulation circuit 108 will act as a low-pass filter, with the cut-off frequency being one half of the frequency of the clock signal supplied to counter circuit 222.

Figure 21:
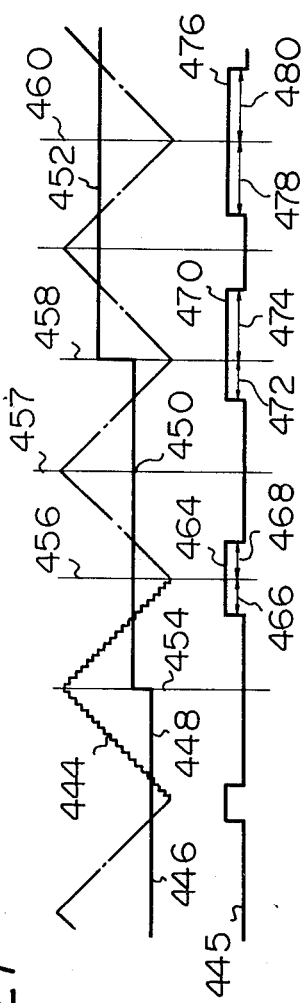
FIG. 21 is a third waveform diagram illustrating the relationship between digital signal values and an output pulse train from a digital-to-analog converter circuit according to the present invention.

Referring now to FIG. 21, waveforms are shown therein to illustrate an interpolation effect which can be obtained with a pulse width modulation circuit according to the present invention, whereby the effective rate at which variable width pulses are output can be increased. This is obtained when the operations of data latch circuit 224 and counter circuit 222 are synchronized and the period of the counter circuit 222 is less than the period between successive changes in the data from data latch circuit 224. Numerals 444 and 446 denote the contents of counter circuit 222 and data latch circuit 224 respectively, in analog form. Numeral 445 denotes the pulse train output from data comparator 234. In this example, the period between successive changes in the data output from data latch circuit 224 is 1.5 times the period of operation of counter circuit 222. Points at which the data from data latch circuit 224 changes are indicated for example by numerals 454 and 458. As shown, for the first pulse which is output from data comparator 234 following a change in the contents of data latch circuit 224, e.g. pulse 464 generated following data transition 454, the pulse width is proportional to the data latch circuit 224 contents 450, and comprises two halves 466 and 468 arranged symmetrically with respect to the changeover point 456 of counter circuit 222. The next pulse from data comparator 234 occurs after a count transition 457 of counter circuit 222, and is denoted by numeral 470. As shown, the first half 472 of this pulse has a duration determined by the contents 450 of data latch circuit 224 prior to point 458, and the second half 474 of pulse 470 has a duration which is determined by the contents of data latch circuit 224 after the transition 458. Subsequently, another pulse 476 is generated, whose width is determined by the value 452 from data latch circuit 224. As for pulse 464, pulse 476 is composed of two equal halves 478 and 480. It can be seen that the width of pulse 470 is equal to one half of the sum of the widths of pulses 476 and 464. In this way, it is possible to achieve a repetition rate for the pulses output from pulse width modulation circuit which is twice that of an arrangement in which the period of operation of counter circuit 222 (i.e. the period between successive up-count to down-count transitions) is equal to the period between successive changes in the content of data latch circuit 224, such as is illustrated by the waveforms of FIG. 19.

A second embodiment of a pulse width modulation circuit according to the present invention will now be described, with reference to FIG. 22. This circuit is based upon the block diagram of FIG. 17, although the clock signal generation means is omitted for simplicity, with clock signals being input to a terminal 518. The circuit comprises a counter circuit 222, a data latch circuit 224, a polarity distribution circuit 238, and a data comparator circuit. This embodiment essentially differs from that of FIG. 18 in that a simple ripple counter is used, with no provision of an up/down count capability. Data supplied from digital acoustic synthesis circuit 20 is supplied as six parallel bits to input terminals 356 to 366 of data latch circuit 224, which comprises six flip-flop stages 494 to 504. The LSB of the data is stored in flip-flop 494, and the MSB, i.e. the sign bit, is stored in flip-flop 504. Counter circuit 222 comprises six flip-flops 506 to 516. The contents of stages 506 to 514 of counter circuit 222 are compared with those of stages 494 to 502 of data latch circuit 224 by a set of exclusive-OR gates 518 to 526, the outputs from which are applied to inputs of an AND gate 530 and an inverting input AND gate 528. When coincidence occurs between the lower five bits of data latch circuit 224 and of counter circuit 222, the output of AND gate 528 does to the H logic level. When coincidence occurs between the complement of the contents of counter circuit 222 and of data latch circuit 224, the output of AND gate 530 goes to the H level. These outputs are applied to a first data selector comprising AND gates 532 and 534 and OR gate 540, and a second data selector comprising AND gate 536 and 538 and OR gate 542. These data selectors are controlled by the level of the sign bit of the data in data latch circuit 224, or by the logical inverse of that sign bit (produced from an inverter 549). It can be seen that when the output from the final stage 516 of counter circuit 222 is at the H level, the output from OR gate 540 is transferred through an AND gate 544 to the reset terminal of a flip-flop 550, while when the output from counter stage 516 is at the L level, the output from OR gate 542 will be transferred through an AND gate 546 to produce an H level output which sets a data-type flip-flop 552. As a result, flip-flop 550 is set. Thus, in response to pulses produced from AND gates 544 and 546, flip-flop 550 is set and reset to produce a pulse train output on line 236, which is applied to polarity distribution circuit 238.

The operation of the circuit of FIG. 22 will now be described, with reference to FIG. 23. In FIG. 23, numeral 576 denotes successive count states of counter circuit 222, in 4-bit increments. Numeral 578 denotes the successive count states of the lower significance five stages of counter circuit, i.e. stages 506 to 514. In this embodiment, the absolute value of a positive number input from digital acoustic synthesis circuit is represented by the lower significance five bits, i.e. the contents of stages 494 to 502 of data latch circuit 224. The absolute value of a negative number is represented by the complement of the lower five bits of the data. The sign bit is at the H logic level for a positive number, and is at the L logic level for a negative number. These relationships are illustrated in Table 1 below.

In Table 1, an h logic level is represented as 1, while an L level is represented as 0. As shown, the maximum negative value of an input data is −31, and the maximum positive value is +31.

TABLE 1

| DIGITAL INPUT DATA | | | | | | RELATIVE OUTPUT PULSE WIDTH AND POLARITY SIGNIFICANCE |
|---|---|---|---|---|---|---|
| MSB | | | | | LSB | |
| 0 | 0 | 0 | 0 | 0 | 0 | −31 (Full-scale negative value) |
| 0 | 0 | 0 | 0 | 0 | 1 | −30 |
| 0 | 1 | 1 | 1 | 1 | 1 | −1 |
| 1 | 0 | 0 | 0 | 0 | 0 | 0 |
| 1 | 0 | 0 | 0 | 0 | 1 | +1 |
| 1 | 1 | 1 | 1 | 1 | 1 | +31 (Full-scale positive value) |

Referring again to FIG. 23, numeral 580 denotes the waveform of pulses produced from AND gate 528 for the case of a data value which is positive and has a value of 6, i.e. N=6. Numeral 582 indicates the output from AND gate 530 for N=6. In this case, an H level output will be produced from stage 504 of data latch circuit 224. When the contents of counter circuit attain a value of 6, by counting in response to a clock signal input through AND gate 520 from terminal 518, then an output pulse (587 in FIG. 23) will be output from AND gate 528. However this pulse will have no effect, since at this time AND gates 538 and 544 are inhibited. Subsequently, when counter circuit 222 attains a value which is the complement of 6, i.e. 25, then an output pulse is produced from AND gate 530, denoted by numeral 583 in FIG. 23. The pulse is applied through AND gate 536, OR gate 542 AND gate 546 and flip-flop 552, to set flip-flop 550, thereby initiating the pulse 585 output from flip-flop 550. Subsequently, when the count in the lower five stages of counter 222 attains a value of 6 once again, but with an H level output being produced from final stage 516 of counter 222, another pulse 581 will be produced by AND gate, which will be transferred through AND gate 534 OR gate 540 and AND gate 544 to thereby reset flip-flop 550. The pulse 585 from flip-flop 550 is thereby terminated.

The process whereby a pulse is output from flip-flop 550 for the case of a negative number being held in data latch circuit 224 in the form shown in Table 1 will now be described. In this case, the output from stage 504 of data latch circuit 224 is at the L logic level. The process will be described assuming a value N of −25. When the count in counter 222 attains a value of 6, then since the absolute value of −25 is represented by its complement, i.e. 6, a pulse 587 shown in FIG. 23 is produced by AND gate 528. This is transferred through AND gate 538, OR gate 542, and AND gate 546., thereby causing an H level output from flip-flop 552 to set flip-flop 550. This initiates the pulse denoted by numeral 589. Subsequently, when a value of 25 is attained by counter circuit 222, an output pulse 591 is output from AND gate 530, which is transferred through AND gate 532, OR gate 540, and AND gate 544 to thereby reset flip-flop 550. Output pulse 589 from flip-flop 550 is thereby terminated.

It will be apparent that it is an essential feature of this embodiment that the center of each pulse which is output from flip-flop 550 occurs at the timing when the contents of the lower five stages of counter circuit 222 return from a maximum count (31 in this example) to zero. Thus, the period between successive variable-width pulses output on line 236 will be constant.

A flip-flop 522 serves to control the input of clock pulses to counter circuit 222 by AND gate 520. Each time the maximum content of counter circuit is reached, a signal is sent on line 517 from flip-flop 516 to digital acoustic synthesis circuit 20. In response, digital acoustic synthesis circuit 20 transmits the next set of data to be applied to terminals 356 to 366 and a signal to control terminal 572 which sets flip-flop 522 to initiate the supply of clock pulses to counter circuit 222 and at the same time read in the new data from digital acoustic synthesis circuit to data latch circuit 224.

The operation of polarity distribution circuit 238 is as described for the embodiment of FIG. 18, being controlled by the output from flip-flop 504 to transfer the pulse train on output line 236 either through AND gate 348, when the sign bit of the digital data is H (positive data) or through AND gate 238 when the sign bit is L (negative data).

Figure 22:
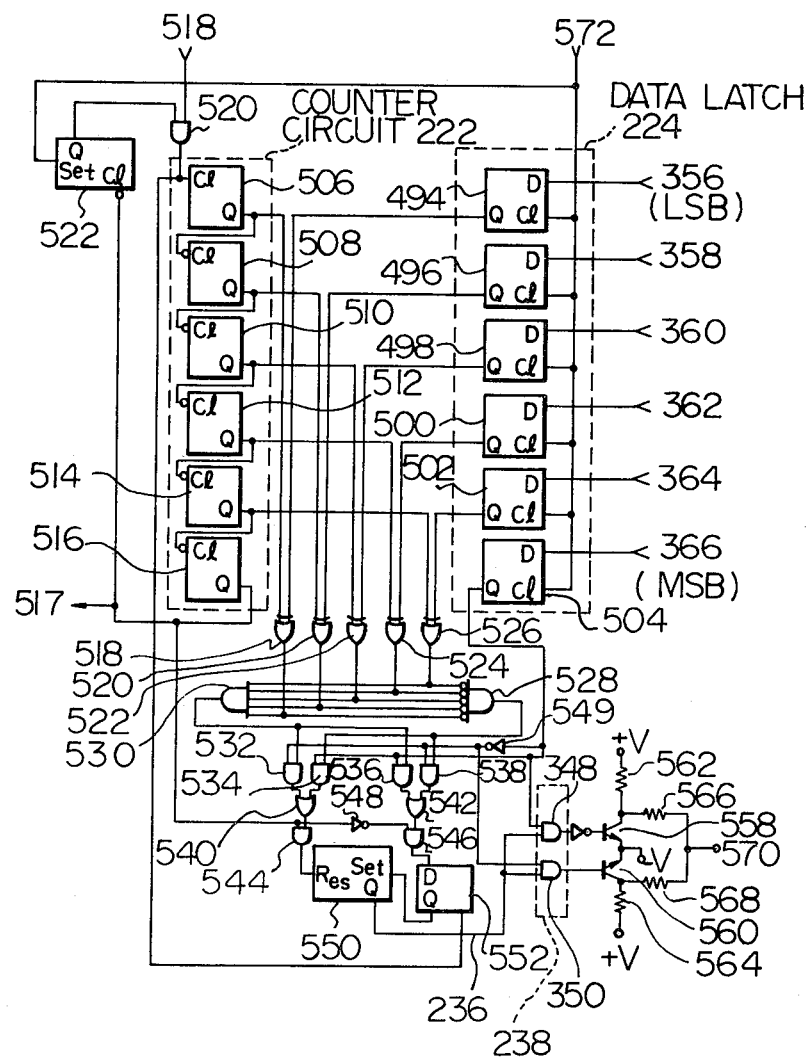
FIG. 22 is a circuit embodiment of a second example of a pulse width modulation circuit according to the present invention.
Figure 23:
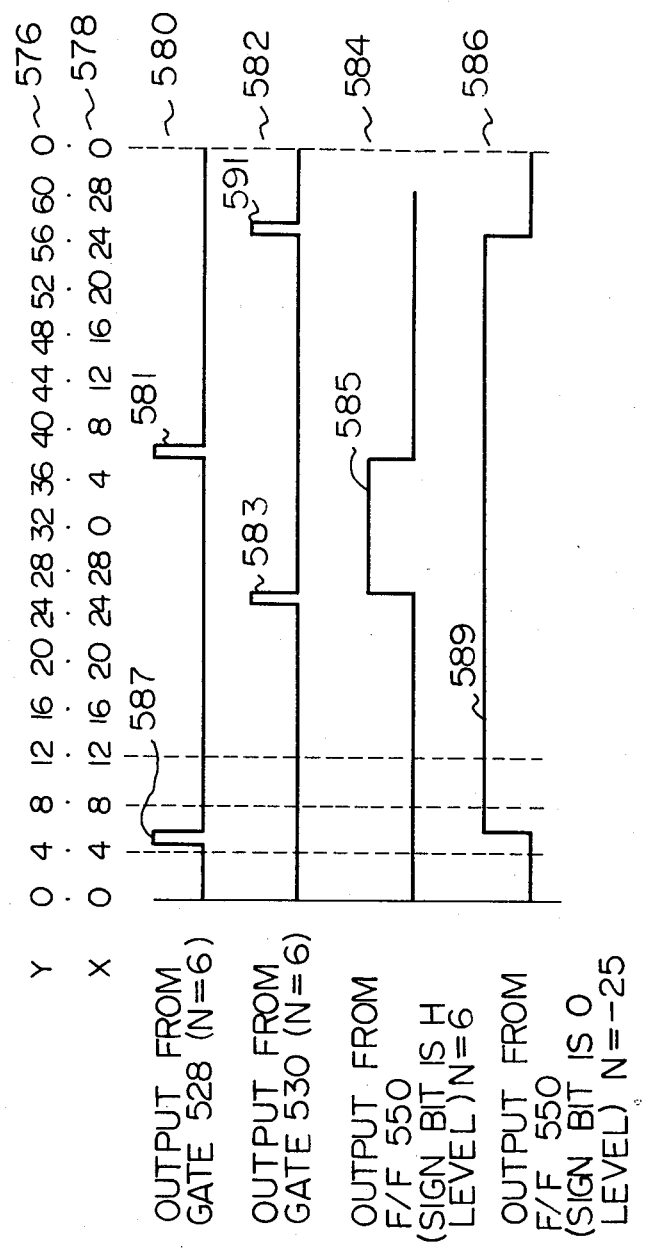
FIG. 23 is a diagram to aid in understanding the operation of the pulse width modulation circuit of FIG. 22.

In FIG. 22, an example of a pulse amplifier circuit is shown, providing a single-ended output from terminal 570 which is either at a positive, negative, or zero potential, in accordance with whether a pulse is output from AND gate 348 of polarity distribution circuit 238, from AND gate 350, or no pulse is being output from polarity distribution circuit 238, respectively. This pulse amplifier circuit comprises two transistors 558 and 560 and resistors 564 to 588, and requires both a positive and a negative supply voltage.

Figure 24:
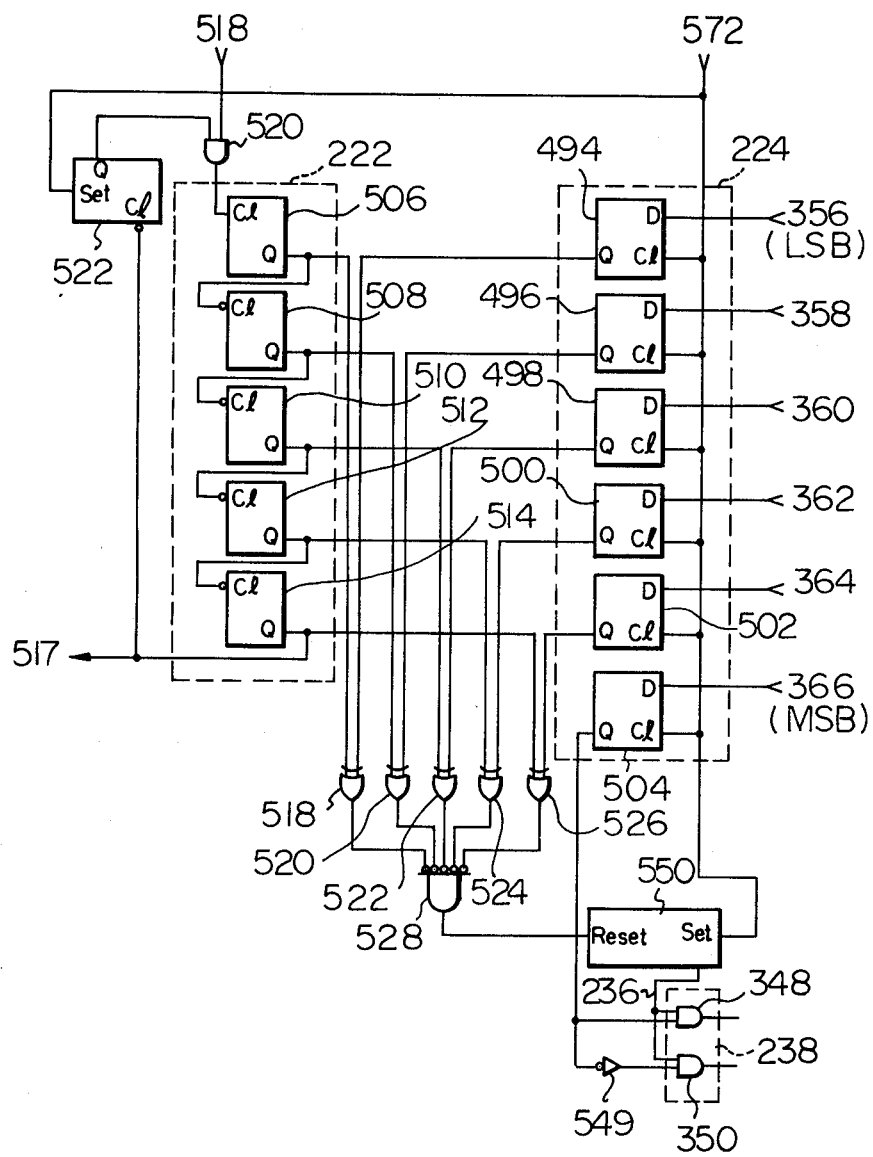
FIG. 24 is a circuit diagram of a third embodiment of a pulse width modulation circuit for a digital-to-analog converter circuit according to the present invention.

Referring now to FIG. 24, another example of a pulse width modulation circuit is shown. This example is a simplified version of that of FIG. 22, in which the functions and configurations of counter circuit 222, data latch circuit 224, polarity distribution circuit 238, control flip-flop 522, and AND gate 520 are all as described for the embodiment of FIG. 22. The data comparator circuit is however simplified, comprising only five exclusive-OR gates 518 to 526 and inverting input AND gate 528. The operation of this circuit is as follows. After each new set of digital data has been sent from the digital acoustic synthesis circuit 20, the latter circuit also transmits a pulse to terminal 572, whereby the new data is stored into latch circuit 224. At the same time, in addition to setting flip-flop 522 to initiate the supply of clock pulses to counter circuit 222, this pulse from digital acoustic synthesis circuit sets flip-flop 550, whose output is applied to polarity distribution circuit 238 over line 236. Subsequently, when the count value in counter circuit reaches the value of the data stored in data latch circuit 224, an output pulse is produced by AND gate 528, which resets flip-flop 550. Thus, during the time from the latching in of data to data latch circuit 224 until the value of that data is equalled by the contents of counter circuit 222, an H level pulse will be produced by flip-flop 550, whose width will be proportional to the value of the data stored in data latch circuit 224. It will be apparent that for this embodiment, the absolute value of negative data stored in data latch circuit 224 must be represented in the same way as for positive data, i.e. by the five lesser significance bits stored in stages 494 to 502, and not as a complement.

Control of output of the pulses generated by flip-flop 550 through either AND gate 348 or AND gate 350 of polarity distribution circuit 238 is performed by the sign bit output from data latch circuit 224 stage 504, as for the embodiment of FIG. 22.

It will be appreciated that with this pulse width modulation circuit embodiment, the period between the mid-points of successive pulses in the output variable-width pulse train will not be constant, but will vary depending upon the pulse widths. As a result, a certain degree of phase distortion will occur in the synthesized acoustic output generated from such a pulse train. However this may be tolerable, in some applications.

Figure 25:
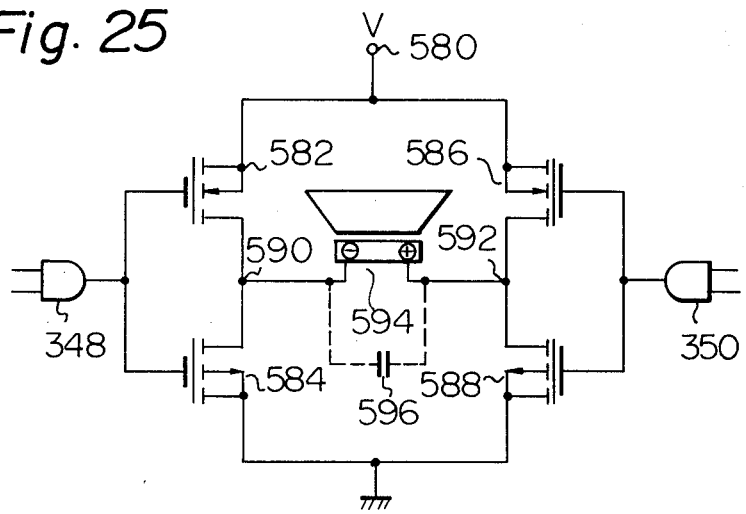
FIGS. 25, 26, 27 and 28 are examples of configurations of pulse amplifier circuits for a digital-to-analog converter circuit according to the present invention.

Some examples of pulse amplifier circuits for a digital to analog converter according to the present invention will now be described. Referring first to FIG. 25, a pulse amplifier circuit is shown whose basic operation is as described for the equivalent circuit of FIG. 10 above. AND gates 348 and 350 correspond to the gates having these numerals which comprise the polarity distribution circuit 238 shown in the embodiments of pulse width modulation circuits described hereinabove. In the intervals between pulses being generated by pulse width modulation circuit 108, the outputs of each of AND gates 348 and 350 will be at the L logic level, so that transistors 584 and 588 are in the OFF (i.e. non-conducting) state, while transistors 582 and 586 are in the ON (i.e. conducting) state, so that each terminal 590 and 592 of audio transducer 28 is connected to the positive supply potential V. When an H level pulse is output from AND gate 97, the states of transistors 582 and 584 become inverted, so that terminal 590 goes to ground potential, and terminal 592 remains at the positive, i.e. supply voltage V potential. This condition will be referred to as application of a positive pulse to audio transducer 28, as designated by the output from AND gate 368 of polarity distribution circuit 238. Similarly, if an H level output is produced from AND gate 350, terminal 592 of audio transducer 28 will go to the ground potential, while terminal 590 is at the positive supply potential. This will be referred to as application of a negative pulse to audio transducer 28, in response to an output from AND gate 350 of polarity distribution circuit 238. A capacitor 596 can be connected across the terminals of audio transducer 28 as shown, to act as a low-pass filter. However, depending upon the characteristics of audio transducer 28, such a low-pass filter element may be eliminated.

Figure 26:
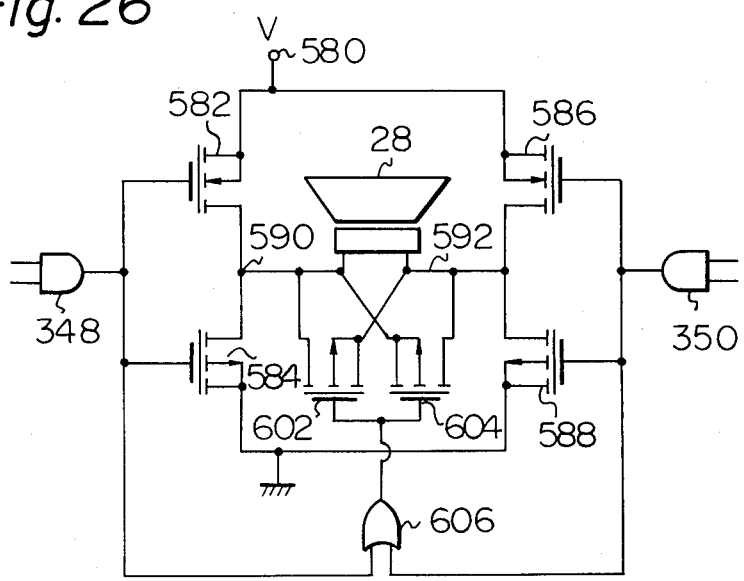

A modified example of the pulse amplifier circuit of FIG. 25 is shown in FIG. 26. Here, transistor 602, transistor 604, and OR gate 606 are added, in order to control the audio transducer 28 during times when no output is being produced by AND gates 348 or 350. Gate 606 serves to detect the absence of pulses from AND gates 348 and 350, and in response to establish a short-circuit condition across terminals 590 and 592 of audio transducer 28, by means of transistors 602 and 604. The output impedance of pulse amplifier circuit 110 as seen from audio transducer 28 is thereby reduced, thereby providing damping of resonance characteristics of audio transducer 28. This results in a purer and less distorted audio output signal.

Figure 27:
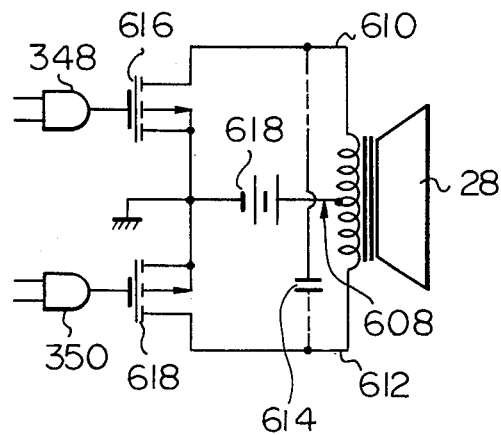

Another embodiment of a pulse amplifier circuit is shown in FIG. 27. In this case, the audio transducer 28 has a voice coil which is provided with a center tap, 608, and positive current-designating pulses from AND gate 348 and negative current-designating pulses from AND gate 350 respectively drive terminals 610 and 612 of audio transducer 28 independently. Use of a capacitor 614 as a low-pass filter element provides the advantages described for the embodiment of FIG. 26, and also serves to absorb voltage transients which are generated across audio transducer 28 each time transistor 616 or 618 enters the cut-off state. An advantage of the embodiment of FIG. 27 is that, when audio transducer 28 is driven by a pulse from AND gate 348 or 350, only a single saturated transistor (i.e. 616 or 618) is connected in series between the voice coil of audio transducer 28 and the power source 618. Thus, the effective voltage available for driving audio transducer 28 is greater then in the case of the embodiments of FIGS. 25 and 26 by an amount equal to the saturation voltage of one transistor. The embodiment of FIG. 27 therefore provides higher efficiency than those of FIG. 25 or 26.

Figure 28:
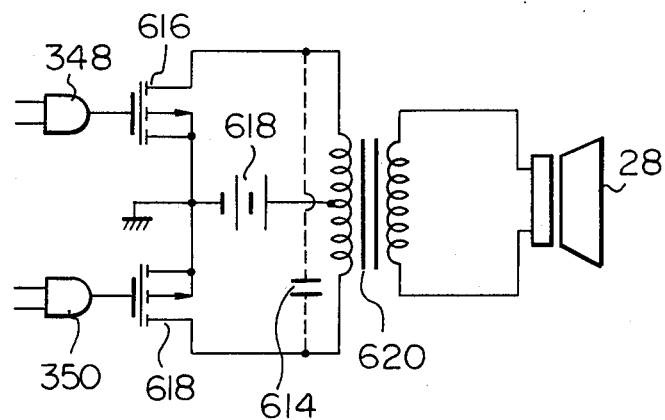

FIG. 28 shows another embodiment of a pulse amplifier circuit, which is basically similar in operation to that of FIG. 27, but which utilizes a center-tapped output transformer 620 to drive audio transducer 28. This embodiment has the advantage of a greater choice of devices for use as audio transducer 28, and in addition, by suitable design of transformer 620, and combination with a capacitor 614 if necessary, excellent low-pass filter characteristics can be obtained.

From the above it can be understood that a low-pass filter function necessary for removing unwanted high frequency components in a variable-width pulse train supplied to the audio transducer of a digital-to-analog a converter circuit according to the present invention can be constituted by one or more discrete shunt or series filter elements, by the characteristics of an output transformer, by the electrical and mechanical characteristics of the audio transducer itself, or by some combination of these factors.

If this filtering is effectively achieved, then the signal/noise performance of a digital-to-analog converter according to the present invention is essentially determined by the quantization noise level. The ratio of signal/quantization noise is given by the formula:

$$S/QN = 6 \times N + 1.8 (dB)$$

where N is the number of bits representing the number of quantization levels, e.g. if there are 256 quantization levels, then since $256 = 2^8$, N is equal to 8.

From the above, it can be understood that a digital-to-analog converter according to the present invention offers a number of important advantages by comparison with conventional types of converter circuits, for application to a speech-synthesizing electronic timepiece. One outstanding advantage is that a pulse amplifier is used to drive the audio transducer producing the synthesized speech. Such a pulse amplifier can attain an efficiency of 90% or more, irrespective of the input signal pulse width. A B-class amplifier on the other hand can only attain a maximum efficiency of the order of 78%, and the efficiency falls below this value depending upon the waveform being amplified. In addition, a digital-to-analog converter according to the present invention provides high accuracy and stable operation when provided with the very low level of supply voltage produced by the battery of an electronic timepiece, in addition to the advantage of very low power consumption. It is yet a further advantage of a digital-to-analog converter according to the present invention that all of the circuit devices utilized, other than the audio transducer, can comprise digital switching elements, such as generally comprise the integrated circuit components of an electronic timepiece, without the necessity for circuit elements which must provide amplification in a linear operating region. It can therefore be understood that a digital-to-analog converter according to the present invention is an important contribution to the practical realization of a speech-synthesizing electronic timepiece.

From the preceding description, it will be apparent that the objectives set forth for the present invention are effectively attained. Since various changes and modifications to the above construction may be made without departing from the spirit and scope of the present invention, it is intended that all matter contained in the above description or shown in the accompanying drawings shall be interpreted as illustrative, and not in a limiting sense. The appended claims are intended to cover all of the generic and specific features of the invention described herein.

What is claimed is:

1. An electronic timepiece powered by a battery and having timekeeping circuit means for producing signals indicative of time information, memory means storing data relating to acoustic signal synthesis in digital form, control circuit means coupled to receive said time information indicating signals and responsive thereto for reading out portions of said data stored in said memory means, digital acoustic synthesis circuit means responsive to signals from said control circuit means and said data read from said memory means for generating a succession of digital signals each specifying at least one amplitude during a predetermined time interval of a portion of an acoustic time indication signal required to be audibly reproduced to indicate said time information, and digital-to-analog conversion means, comprising:

pulse width modulation circuit means responsive to successive ones of said digital signals for generating a train of pulses wherein the duration of each pulse is proportional to a numeric value represented by a corresponding one of said digital signals from said digital acoustic signal synthesis means;

pulse amplifier means coupled to receive said pulse train from said pulse width modulation circuit means; and electro-acoustic transducer means coupled to receive said pulse train from said pulse amplifier means, and responsive thereto for eliminating frequency components of said pulse train which are outside a frequency band containing said acoustic time indication signal and for reproducing said acoustic time indication signal in audible form.

2. An electronic timepiece according to claim 1, wherein said electro-acoustic transducer comprises a combination of low-pass filter means and an audio transducer.

3. An electronic timepiece according to claim 2, wherein said low-pass filter means comprises a choke filter coupled between said pulse width modulation circuit means and said audio transducer.

4. An electronic timepiece according to claim 2, wherein said low-pass filter means comprises a capacitive element connected across input terminals of said audio transducer.

5. An electronic timepiece according to claim 1, wherein said electro-acoustic transducer means comprises an audio transducer having mechanical and electrical characteristics such as to eliminate pulse train frequency components outside a frequency band of the acoustic time indication signal and thereby to audibly reproduce said acoustic time indication signal alone.

6. An electronic timepiece according to claim 1, wherein said digital acoustic synthesis circuit further produces as a portion of each of said digital signals data specifying a polarity of said portion of said acoustic time indication signal during said predetermined time interval, and further wherein said pulse width modulation circuit means includes polarity distribution circuit means responsive to said polarity specifying data in said digital signals for selectively applying pulses of said pulse train from said pulse width modulation circuit means through said pulse amplifier circuit means to drive said electro-acoustic transducer means with a polarity determined by said polarity specifying data.

7. An electronic timepiece according to claim 6, wherein said polarity specifying data comprises a sign bit contained in each of said digital signals from said digital acoustic synthesis circuit means, and further wherein said pulse width modulation circuit means includes latch circuit means for temporarily storing the state of said sign bit and wherein said polarity distribution circuit means comprises gate means coupled to receive said pulse train from said pulse width modulation circuit means and controlled in accordance with an output produced by said sign bit storage latch circuit means for selectively transferring pulses of said pulse train to a first and a second output terminal of said polarity distribution circuit means, and further wherein said pulse amplifier circuit means is responsive to pulses output from said first terminal of said polarity distribution circuit for driving said electro-acoustic transducer means with signals of a first polarity and responsive to pulses output from said second terminal of said polarity distribution circuit for driving said electro-acoustic transducer means with signals of a second polarity opposite to said first polarity.

8. An electronic timepiece according to claim 7, wherein said pulse amplifier circuit means comprises a first electronic switch coupled between a first potential of said battery and a first terminal of said electro-acoustic transducer means, a second electronic switch connected between a second potential of said battery and said first terminal of said electro-acoustic transducer means, a third electronic switch coupled between said first potential of said battery and a second terminal of said electro-acoustic transducer means and a fourth electronic switch coupled between said second potential of said battery and said second terminal of said electro-acoustic transducer means, and wherein said first and fourth electronic switches are responsive to a pulse output from said first terminal of said polarity distribution circuit means for being closed during an interval corresponding to the duration of said pulse and further wherein said second and third electronic switches are responsive to a pulse output from said second terminal of said polarity distribution circuit for being closed during an interval corresponding to the duration of the latter-mentioned pulse, whereby a drive signal of a first polarity is applied across said terminals of said electro-acoustic transducer means in response to each output pulse from said first terminal of said polarity distribution circuit and a drive signal of opposite polarity to said first polarity is applied between said terminals of said electro-acoustic transducer means in response to each output pulse from said second terminal of said polarity distribution circuit.

9. An electronic timepiece according to claim 8, wherein each of said electronic switches comprises at least one transistor element.

10. An electronic timepiece according to claim 8, and further comprising circuit means for detecting a condition in which no pulse output is being produced from said polarity distribution circuit, and for establishing an effective short-circuit condition across said terminals of said electro-acoustic transducer while said condition exists.

11. An electronic timepiece according to claim 1, wherein said electro-acoustic transducer comprises a miniature electrodynamic loudspeaker having a voice coil.

12. An electronic timepiece according to claim 11, wherein said voice coil is provided with a center tap, and wherein said center tap is coupled to a potential of said battery.

13. An electronic timepiece according to claim 12, and further comprising a transformer coupled between said voice coil and said pulse amplifier circuit means.

14. An electronic timepiece according to claim 1, wherein said digital signals from said digital acoustic synthesis circuit means each comprises a plurality of data bits of successively increasing significance supplied in parallel form, together with a sign bit, and wherein said pulse width modulation circuit comprises:
    data latch circuit means responsive to a signal emitted by said digital acoustic synthesis circuit means for storing said data bits and said sign bit;
    a source of a clock signal;
    counter circuit means responsive to said clock signal for counting pulses thereof; and
    data comparator circuit means for comparing the count in said counter circuit means with the contents of said data latch circuit means and for thereby producing a pulse having a duration proportional to a numeric value represented by said data bits in said data latch circuit means.

15. An electronic timepiece according to claim 14, wherein said data comparator circuit means detects a condition in which the numeric value represented by said data bits in said data latch circuit means exceeds the count value in said counter circuit means and generates an output pulse for the duration of said condition.

16. An electronic timepiece according to claim 15, wherein said counter circuit means comprises a reversible counter circuit, and wherein a fixed timing relationship exists between successive changes in said data bits stored in said data latch circuit means and successive changes in the operation of said counter circuit means from an up-count condition to a down-count condition.

17. An electronic timepiece according to claim 16, wherein a signal is generated by said counter circuit means upon each of said transitions from an up-count condition to a down-count condition and wherein said digital acoustic synthesis circuit means is responsive to said signal for generating a new set of data dits and storing said new set of data bits in said data latch circuit means.

18. An electronic timepiece according to claim 14, wherein said data comparator circuit means comprises a plurality of data circuits, each coupled to receive an output from one stage of said data latch circuit means and an output from a corresponding stage of said counter circuit means.

19. An electronic timepiece according to claim 14, wherein said digital acoustic synthesis circuit means generates a control signal each time a new set of data bits and sign bits are output therefrom, and further comprising control circuit means responsive to said control signal for enabling said clock signal to be applied to said counter circuit means and responsive to attainment of a predetermined count value by said counter circuit means for inhibiting the application of said clock signal to said counter circuit means, and wherein said data comparator circuit means comprises a flip-flop circuit responsive to said control signal from said digital acoustic synthesis circuit means for being set to thereby initiate the output of a pulse, and gate circuit means coupled to said counter circuit means and to said data latch circuit means for detecting coincidence between the contents of said counter circuit means and said data latch circuit means and producing an output signal indicative thereof, said flip-flop circuit being responsive to the latter-mentioned output signal for being reset, to thereby terminate said output pulse from said flip-flop circuit, whereby the duration of said output pulse from said flip-flop circuit is proportional to a numeric value represented by said data bits stored in said data latch circuit means.

20. An electronic timepiece according to claim 14, wherein said digital acoustic synthesis circuit means generates a control signal each time a new set of data bits and a sign bit are output therefrom, and wherein the absolute value of a negative number represented by said data bits is in the form of the complement of said absolute value, and further comprising control circuit means responsive to said control signal for enabling said clock signal to be applied to said counter circuit means and responsive to attainment of a predetermined count value by said counter circuit means for inhibiting the supply of said clock signal to said counter circuit means, said data latch circuit means being responsive to said control signal for storing a new set of data bits from said digital acoustic synthesis circuit means therein, an moreover wherein the number of stages of said counter circuit means is greater by one than the number of stages of said data latch circuit means whereby the maximum count of said counter circuit means is twice that of the maximum number representable by the date bits stored in said data latch circuit means, said pulse width modulation circuit means further comprising first gate circuit means for comparing the contents of said counter circuit means exclusive of the most significant stage thereof with said data bits stored in said data latch circuit means and for producing an output signal from a first terminal thereof when the contents of said counter circuit means excluding the most significant stage thereof coincide with the complement of the contents of said data latch circuit means and for producing an output signal on a second terminal thereof when the contents of said counter circuit coincide with the contents of said data latch circuit means, and second gate circuit means responsive to the logic state of the most significant stage of said counter circuit means, to the logic state of said sign bit stored in said data latch circuit means, and to output signals from said first and second terminals of said first gate circuit means for producing an output pulse on a first terminal thereof when the contents of said counter circuit means exclusive of the most significant stage thereof coincide with the complement of said data bits in said data latch circuit means if said sign bit indicates a positive number and for producing an output pulse on a second terminal thereof when the contents of said counter circuit means coincide with said data bits in said data latch circuit means, if said sign bit indicates a positive number, and further for producing an output pulse from said first terminal thereof when the contents of said counter circuit means coincide wth the data bits of said data latch circuit means if said sign bit indicates a negative number and for producing an output pulse from said second terminal thereof when the contents of said counter circuit means coincide with the complement of said data bits in said data latch circuit means if said sign bit indicates a negative number, said pulse width modulation circuit means further comprising a flip-flop circuit coupled to be set by an output pulse from said first terminal of said second gate circuit means to thereby initiate an output pulse, and coupled to be reset by an output pulse from said second terminal of said second gate circuit means to thereby terminate said output pulse, whereby the duration of said output pulse from said flip-flop circuit is proportional to the absolute value of the number represented by the data bits stored in said data latch circuit means.

* * * * *